United States Patent
McMahon

(10) Patent No.: US 10,233,903 B2
(45) Date of Patent: Mar. 19, 2019

(54) MOBILE RENEWABLE ENERGY STRUCTURES PROVIDING WIRELESS NETWORKING AND ASSOCIATED SYSTEMS AND METHODS

(71) Applicant: Primo Wind, Inc., San Diego, CA (US)

(72) Inventor: Edward McMahon, San Diego, CA (US)

(73) Assignee: Primo Wind, Inc., San Diego, CA (US)

( * ) Notice: Subject to any disclaimer, the term of this patent is extended or adjusted under 35 U.S.C. 154(b) by 0 days.

(21) Appl. No.: 15/893,402

(22) Filed: Feb. 9, 2018

(65) Prior Publication Data
US 2018/0238305 A1 Aug. 23, 2018

Related U.S. Application Data

(63) Continuation-in-part of application No. 29/542,770, filed on Oct. 16, 2015.

(51) Int. Cl.
*F03D 9/00* (2016.01)
*H02P 9/04* (2006.01)
(Continued)

(52) U.S. Cl.
CPC ............ *F03D 13/22* (2016.05); *F03D 9/007* (2013.01); *F03D 9/25* (2016.05); *F03D 9/34* (2016.05);
(Continued)

(58) Field of Classification Search
CPC ... F03D 13/22; F03D 9/25; F03D 9/34; F03D 9/007
(Continued)

(56) References Cited

U.S. PATENT DOCUMENTS

| 4,200,904 A | * | 4/1980 | Doan ...................... F21S 8/086 136/291 |
| 4,812,958 A | * | 3/1989 | Rolfe ...................... E04F 17/08 174/45 R |

(Continued)

FOREIGN PATENT DOCUMENTS

CN 204683064 10/2015

OTHER PUBLICATIONS

Femtocells, Microcells, and Metrocells: The Complete Guide to Small Cells, RepeaterStore, available at https://www.repeaterstore.com/pages/femtocell-and-microcell, updated Dec. 3, 2017.
(Continued)

*Primary Examiner* — Tulsidas C Patel
*Assistant Examiner* — Thomas K Quigley
(74) *Attorney, Agent, or Firm* — Perkins Coie LLP

(57) ABSTRACT

A system for providing access to a wireless communication network can include a plurality of renewable energy structures. Each renewable energy structure can include an electricity generation assembly, a telescoping support pole positioned to support the electricity generation assembly, and a wireless communication device configured to relay wireless communication signals between a host signal source and a client device. The electricity generation assembly can include a wind turbine assembly and/or a solar power structure. The wireless communication device can include a cellular telephone signal repeater and/or wireless internet equipment. Each structure can include a display, such as an advertisement, one or more benches, and/or a container. Each structure can optionally include a water purification system, one or more cameras, one or more lights, and/or one or more motion or voice sensors for activating or deactivating various components of the system. Each structure may be permanently installed or mobile.

15 Claims, 15 Drawing Sheets

(51) Int. Cl.
F03D 13/20 (2016.01)
H04W 88/08 (2009.01)
F03G 6/00 (2006.01)
F03D 9/25 (2016.01)
F03D 9/34 (2016.01)
H01L 31/04 (2014.01)
G09F 15/00 (2006.01)

(52) U.S. Cl.
CPC .............. *F03G 6/001* (2013.01); *H01L 31/04* (2013.01); *H04W 88/08* (2013.01); *F05B 2240/91521* (2013.01); *G09F 15/0037* (2013.01)

(58) Field of Classification Search
USPC ....................................................... 290/44, 55
See application file for complete search history.

(56) References Cited

U.S. PATENT DOCUMENTS

| | | | | |
|---|---|---|---|---|
| 5,149,188 | A | * | 9/1992 | Robbins .................. F21S 8/086 136/291 |
| D353,014 | S | | 11/1994 | Elazari |
| D395,419 | S | | 6/1998 | Armanno, Sr. |
| 6,155,646 | A | * | 12/2000 | Sisson .................... A01M 31/02 248/407 |
| D465,450 | S | | 11/2002 | Armanno |
| D595,885 | S | | 7/2009 | Daidone |
| D602,861 | S | | 10/2009 | Talab |
| D622,887 | S | * | 8/2010 | Lewis ............................ D26/71 |
| 7,976,180 | B1 | * | 7/2011 | Haun ...................... F21S 8/086 362/153.1 |
| 8,288,884 | B1 | | 10/2012 | Malcolm |
| 8,432,053 | B2 | | 4/2013 | Frayne |
| D685,725 | S | | 7/2013 | Kunz |
| D688,621 | S | | 8/2013 | Mozzardi |
| 8,564,147 | B1 | | 10/2013 | Sharp |
| D723,205 | S | | 2/2015 | Prommel et al. |
| 9,041,238 | B2 | | 5/2015 | McMahon |
| 9,228,370 | B1 | * | 1/2016 | Boniface ................. E04H 12/34 |
| D751,946 | S | | 3/2016 | Soofer |
| 9,599,299 | B2 | | 3/2017 | Hoang |
| 9,797,370 | B1 | | 10/2017 | McMahon et al. |
| 9,869,299 | B2 | * | 1/2018 | Blake ....................... F03D 7/047 |
| 9,949,886 | B2 | * | 4/2018 | Henshue ................. A61H 3/061 |
| 2003/0206769 | A1 | * | 11/2003 | Mayer Rodis .......... E01F 13/12 404/6 |
| 2006/0011194 | A1 | | 1/2006 | Hensley et al. |
| 2007/0090653 | A1 | * | 4/2007 | Martelon ................. F03D 9/007 290/55 |
| 2009/0224554 | A1 | | 9/2009 | Flynn |
| 2009/0303327 | A1 | * | 12/2009 | Horiuchi .......... G08B 13/19608 348/152 |
| 2010/0090605 | A1 | * | 4/2010 | Nevins .................... F03D 9/007 315/159 |
| 2010/0101988 | A1 | | 4/2010 | Saeed et al. |
| 2010/0117369 | A1 | * | 5/2010 | Monostory ............. F03D 9/007 290/55 |
| 2010/0183443 | A1 | | 7/2010 | Thorne |
| 2010/0207452 | A1 | | 8/2010 | Saab |
| 2010/0207453 | A1 | | 8/2010 | Oilman |
| 2010/0220467 | A1 | * | 9/2010 | Daidone .................. F21S 8/086 362/183 |
| 2010/0224558 | A1 | * | 9/2010 | Barker ................... B01D 61/12 210/636 |
| 2010/0289269 | A1 | | 11/2010 | Christy et al. |
| 2011/0133689 | A1 | | 6/2011 | Uchihashi et al. |
| 2011/0176256 | A1 | | 7/2011 | Van Straten |
| 2012/0025536 | A1 | | 2/2012 | Kimberg |
| 2012/0181973 | A1 | | 7/2012 | Lyden |
| 2012/0260967 | A1 | | 10/2012 | Dwyer et al. |
| 2013/0240024 | A1 | | 9/2013 | Kim |
| 2014/0017580 | A1 | | 1/2014 | Munier et al. |
| 2014/0217740 | A1 | | 8/2014 | McMahon |
| 2014/0311085 | A1 | * | 10/2014 | Fernandez Gomez ...................... E04H 12/12 52/745.18 |
| 2014/0318007 | A1 | * | 10/2014 | Hogan ................... F16M 11/18 47/39 |
| 2016/0204650 | A1 | | 7/2016 | Hornsby |
| 2017/0019588 | A1 | | 1/2017 | Gordon |
| 2017/0108238 | A1 | | 4/2017 | McMahon |
| 2017/0122546 | A1 | | 5/2017 | Abbott et al. |
| 2017/0226986 | A1 | | 8/2017 | Donnelly |
| 2017/0306921 | A1 | | 10/2017 | Young |

OTHER PUBLICATIONS

Primo Wind, Inc. Facebook profile, available at https://www.facebook.com/pg/primowind/photos/?tab=album&album_id=538099226389100.
Smartflower POP—The world's first all-in-one solar system, SmartFlower, available at https://www.smartflower.com/en.
Solar Trees—attractive solar panels that double as street lights!, Ministry of Awesome, previously available at http://www.ministryofawesome.com/ideas/solar-trees-attractive-solar-panels-double-street-lights.
Primo Wind, Inc. website, available at http://primowind.com/.
Solar Structure at Home in Quad, Creighton University, available at https://ccas.creighton.edu/news/solar-structure-home-quad.
New EnergiPlant Wind Turbine Provides Power and Public Space, UC San Diego, Jun. 2, 2017, available at https://cer.ucsd.edu/_news-events-articles/2017/news-ESW-wind-turbine-dedication.html.
Smartflower POP—the world's first all-in-one solar system brochure, SmartFlower, available at https://www.smartflower.com/assets/smartflowerpop-us-aca6f94828c0ced17ad80dd50392ee59.pdf.
International Search Report and Written Opinion for PCT/US2018/029960, dated Jul. 13, 2018.
Baskas, Harriet, Airports add outlets to serve power-parched passengers, USA Today, Nov. 20, 2013, available at https://www.usatoday.com/story/travel/flights/2013/11/20/airport-power-electric-outlet-charging-station/3641489/.

* cited by examiner

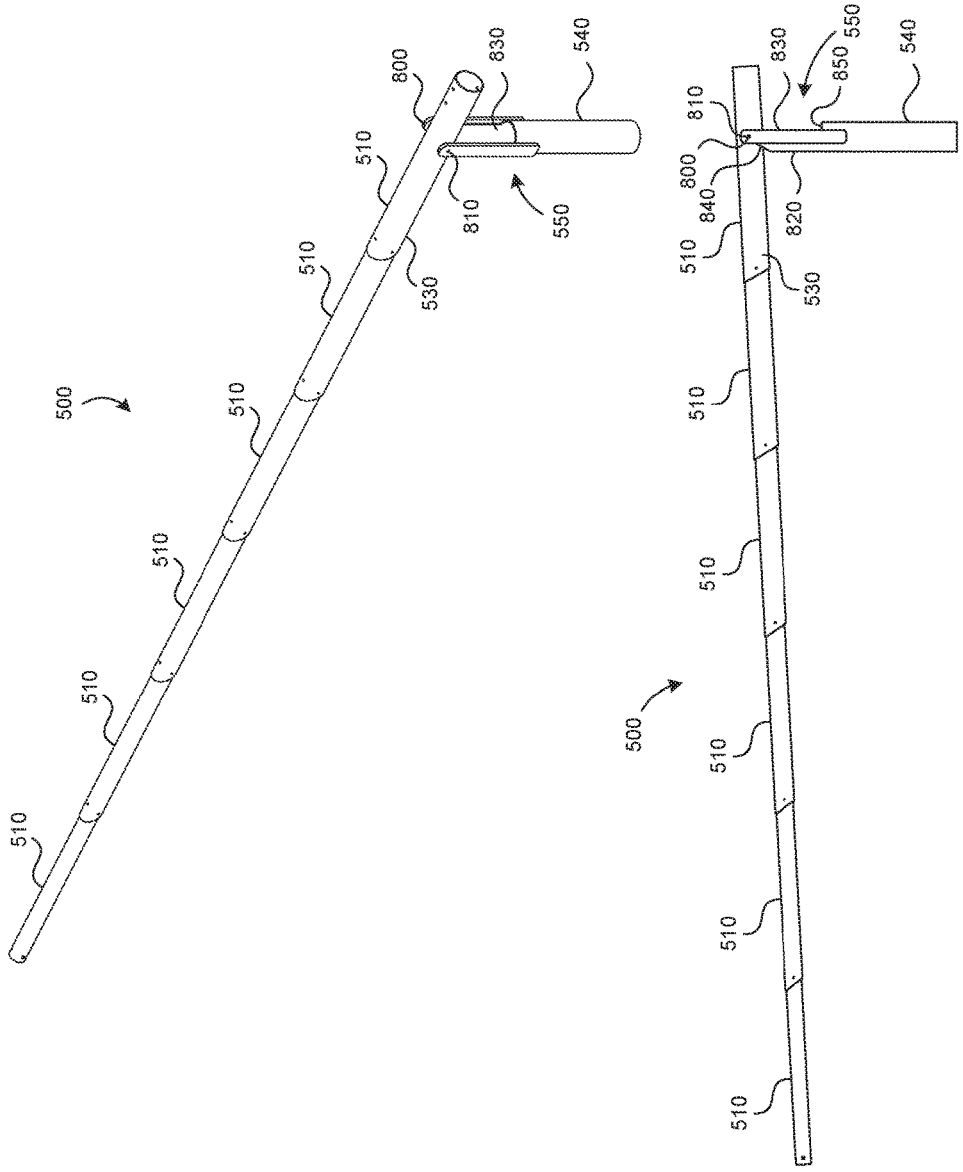

MOBILE RENEWABLE ENERGY STRUCTURES PROVIDING WIRELESS NETWORKING AND ASSOCIATED SYSTEMS AND METHODS

CROSS-REFERENCE TO RELATED APPLICATION

The present application is a continuation-in-part of U.S. patent application Ser. No. 29/542,770, filed Oct. 16, 2015, which is incorporated herein in its entirety by reference.

TECHNICAL FIELD

The present technology is directed generally to mobile renewable energy structures that are easy to install, provide an adaptable wireless mesh network, and which can include wind turbine assemblies and solar panel structures.

BACKGROUND

There is an ever-increasing need for alternative energy sources to reduce society's demand for fossil fuels. For example, solar and wind energy are alternative energy sources that are freely available and produce zero emissions.

In addition to the increasing desire for improved energy production, there is a growing need for improved energy access. For example, there is an increasing desire for distributed energy, which is energy that is created, stored, and/or used locally on a small scale, as opposed to on a larger scale such as large wind farms or power plants operated by utility companies. Distributed or local energy can be implemented to support off-grid sites (i.e., sites that are not connected to a regional power grid) or it can supplement on-grid sites.

As portable devices and wireless communications become more prevalent in modern society, there is also a need to improve access to signals and electricity. For example, many places where people gather lack sufficient access to communication signals like wireless internet or cellular signals, or power for charging devices. In a particular example, attendees of major sporting events, conferences, concerts, or parks often find that cellular coverage is weak, unreliable, or nonexistent. People in certain areas, like cities, parks, or college campuses, often find themselves out of range of wireless internet.

As society becomes increasingly dependent on portable devices and wireless communications, damage to infrastructure that impedes access to electricity or cellular and other wireless communications networks can be catastrophic for people relying on that infrastructure. For example, natural disasters may destroy communications towers and elements of the power grid. Likewise, such disasters or other events may impact security in a town or city. Damage to infrastructure, such as the damage caused by natural disasters or other events, may necessitate temporary support when communications networks, power grids, or both go down.

One problem with existing technology, such as distributed energy sources or wireless communications repeaters like cellular towers, is that they may be large, obstructive, or otherwise aesthetically displeasing, especially in certain urban or rural environments. They may also be difficult to transport, install, and/or power.

SUMMARY

The following summary is provided for the convenience of the reader and identifies several representative embodiments of the disclosed technology. Such representative embodiments are examples only and do not constitute the full scope of the invention.

Representative embodiments of the present technology include a structure for providing wireless communication coverage and off-grid electrical power. In a particular representative embodiment of the present technology, the structure can include a telescoping support pole pivotably attached to a foundation, a wind turbine assembly for converting wind to electrical power, a solar panel structure for converting light to electrical power, a battery connected to the wind turbine assembly and the solar panel structure, an electrical power access point, and a wireless communication device. The wind turbine assembly and/or the solar panel structure can be supported by the support pole.

In some embodiments, the structure can further include one or more cameras supported by the support pole. The structure can further include one or more lights. In some embodiments, the structure can further include one or more benches configured to provide seating for users.

Another representative embodiment of the present technology includes a structure for providing wireless communication coverage. The structure can include a support pole, a wind turbine assembly supported by the support pole, for converting wind to electrical power, a solar panel structure supported by the support pole, for converting light to electrical power, and one or more components contained in the structure. The one or more components can include a cellular telephone signal repeater or a wireless internet router.

In some embodiments, the support pole can include a plurality of telescoping pole segments. In some embodiments, the support pole can extend from a foundation. In some embodiments, the foundation can be mounted to the ground by being at least partially buried in a ground area or cemented to the ground area. In some embodiments, the support pole can pivot relative to the foundation.

In further representative embodiments, a structure can include a base and one or more benches. The foundation can be contained within the base and the benches can be attached to the base. In some embodiments, the structure can include a camera supported by the support pole. The structure can further include an electrical power access point.

Another representative embodiment of the present technology includes a system for providing access to a wireless communication network. The system can include a plurality of renewable energy structures. Each renewable energy structure can include an electricity generation assembly, a foundation, a telescoping support pole attached to the foundation and positioned to support the electricity generation assembly above the foundation, and a wireless communication device configured to relay wireless communication signals between a host signal source and a client device.

In some embodiments, the electricity generation assembly can include at least one of a wind turbine assembly and a solar power structure. In some embodiments, the wireless communication device can include a cellular telephone signal repeater. In some embodiments, the telescoping support pole is pivotably attached to the foundation.

In a further representative embodiment, the system can further include a display positioned near the foundation, one or more benches, and/or a container positioned around the foundation. In some embodiments, the container can contain or include a water purification system. In a further embodiment, one or more of the renewable energy structures can further include a camera or a light supported by the support pole.

Other features and advantages will appear hereinafter. The features described above can be used separately or together, or in various combinations of one or more of them.

BRIEF DESCRIPTION OF THE DRAWINGS

In the drawings, wherein the same reference number indicates the same element throughout the views:

FIGS. 5-9 illustrate a telescoping and articulating support pole for a wind turbine assembly and/or a solar power structure in accordance with another embodiment of the present technology.

FIG. 5 illustrates a side view of the telescoping and articulating support pole in an extended or raised configuration.

FIG. 6 illustrates a front view of the telescoping and articulating support pole shown in FIG. 5.

FIG. 7 illustrates a rear view of the telescoping and articulating support pole in a collapsed configuration, in which telescoping pole segments have been collapsed into the lowermost telescoping pole segment, according to an embodiment of the present technology.

FIG. 8 illustrates a perspective view of the telescoping and articulating support pole shown in FIGS. 5-7 in which telescoping pole segments are extended and pivoted relative to a foundation via an articulating joint, according to an embodiment of the present technology.

FIG. 9 illustrates a side view of the configuration of the support shown in FIG. 8.

DETAILED DESCRIPTION

Figure 1:
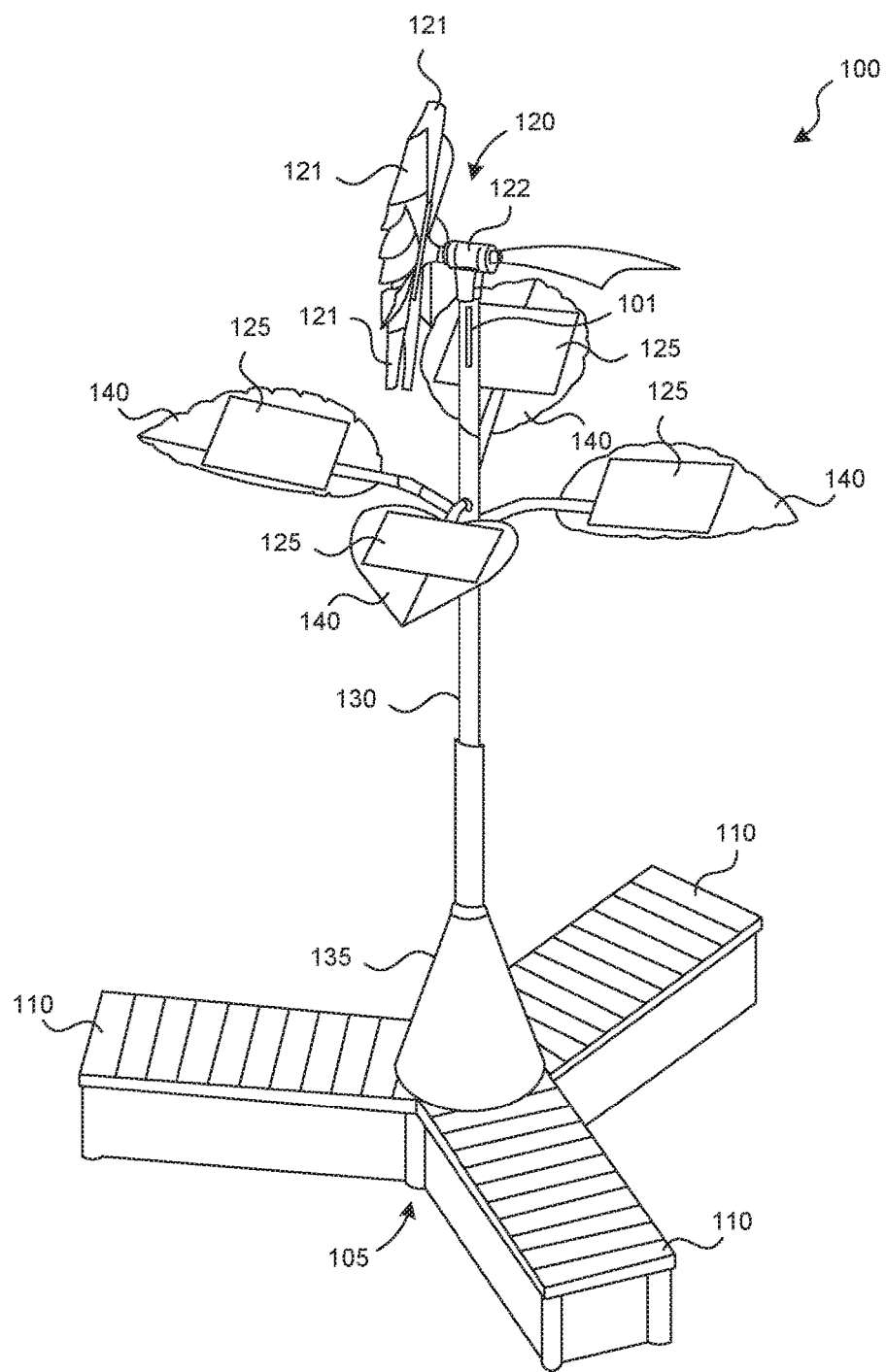
FIG. 1 illustrates a perspective view of a renewable energy structure according to an embodiment of the present technology.

The present technology is directed to permanent and mobile renewable energy structures providing wireless networking, and associated systems and methods. Various embodiments of the technology will now be described. The following description provides specific details for a thorough understanding and an enabling description of these embodiments. One skilled in the art will understand, however, that the invention can be practiced without many of these details. Additionally, some well-known structures or functions such as solar panels, wind turbines, lights, cameras, or wireless communications equipment, such as wireless internet or cellular communications equipment, may not be shown or described in detail so as to avoid unnecessarily obscuring the relevant description of the various embodiments. Accordingly, the technology can include other embodiments with additional elements or without several of the elements described below with reference to FIGS. 1-17, which illustrate examples of the technology.

The terminology used in the description presented below is intended to be interpreted in its broadest reasonable manner, even though it is being used in conjunction with a detailed description of certain specific embodiments of the technology. Certain terms can even be emphasized below; however, any terminology intended to be interpreted in any restricted manner will be overtly and specifically defined as such in this detailed description section.

Where the context permits, singular or plural terms can also include the plural or singular term, respectively. Moreover, unless the word "or" is expressly limited to mean only a single item exclusive from the other items in a list of two or more items, then the use of "or" in such a list is to be interpreted as including (a) any single item in the list, (b) all of the items in the list, or (c) any combination of items in the list. Further, unless otherwise specified, terms such as "attached" or "connected" are intended to include integral connections, as well as connections between physically separate components.

Specific details of several embodiments of the present technology are described herein with reference to wind turbines, solar panels, benches, and bus stops. The technology can also be used in other areas or industries in which distributed energy can be used to provide power or access to communications. For example, embodiments of the present technology can be used with other sources of energy, including fossil fuels, geothermal energy, water power, or other suitable sources of energy. Further, embodiments of the present technology can be implemented in various structures beyond the structures specifically mentioned herein, such as desks, sheds, car ports, phone booths, or other suitable structures where the technology can be useful. Conventional aspects of some elements of the technology may be described in reduced detail herein for efficiency and to avoid obscuring the present disclosure of the technology.

FIG. 1 illustrates a perspective view of a renewable energy structure 100 according to an embodiment of the present technology. As described below, structures according to the present technology, such as the structure 100 illustrated in FIG. 1, can provide an off-grid or remote source of electrical power (from wind or solar energy) for various uses. For example, uses can include powering wireless communication equipment and devices such as Wi-Fi® wireless internet equipment and devices, sometimes known as "hotspots," or cellular phone signal repeaters, sometimes known as metrocells, picocells, and femtocells. Other uses can include powering electrical access points for charging portable devices, or powering accessories such as motion sensors, cameras, lights, or water purification systems, or for powering any of the systems or objects described herein, or other suitable devices.

Renewable energy structures according to the present technology can be permanently installed or they can be mobile. Mobility allows the structures to be easily relocated depending on need for wireless coverage or electrical access. The use of renewable energy like wind and solar allows the structures to be located in a selected position regardless of whether the position has access to traditional power. Accordingly, the present technology can provide permanent or temporary support for access to electricity or communications networks even when traditional infrastructure is damaged or otherwise overburdened or unavailable. By including wind and solar power generation capabilities in one easily-assembled, mobile unit, the present technology provides adaptability for various conditions. For example, the structures can generate electricity from wind at night or on foggy days when solar power is unavailable, and they can generate electricity from the sun on low-wind days.

In a representative embodiment, renewable energy structures according to the present technology can include wireless communication devices or equipment 101, such as cellular or WiFi® wireless internet signal equipment (which can be in the form of an antenna and corresponding controllers and electronics such as repeater equipment) to provide coverage to "dead zones" or areas where bandwidth is in high demand, while also optionally providing power for other devices described in further detail below, or providing a place for users to sit.

The structure 100 can include a base 105, which can optionally include one or more benches 110 (such as three benches 110). The base 105 can support a support pole 130, which can further support an electricity generation assembly such as a wind turbine assembly 120 or one or more (for example, four) solar panel structures 125. A cover 135 can optionally be included to cover the interface between the support pole 130 and the base 105.

In some embodiments, the wind turbine assembly 120 can be a conventional wind turbine assembly, with a number of turbine blades 121 collectively forming at least part of a wind turbine rotor and a generator 122 for generating electricity from rotation of the wind turbine blades 121, or in other embodiments, it can be other types of wind turbine assemblies. For example, the wind turbine assembly could include a Savonius-type or other vertical axis wind turbine. In some embodiments, the wind turbine assembly 120 can include a rotor or turbine or related assembly disclosed or described in U.S. patent application Ser. No. 15/462,634 (filed Mar. 17, 2017), Ser. No. 15/462,686 (filed Mar. 17, 2017 and issued as U.S. Pat. No. 9,797,370), and Ser. No. 15/709,873 (filed Sep. 20, 2017), each of which is incorporated herein in its entirety by reference. In some embodiments, the wind turbine assembly 120 can include a propeller-style rotor or a fan-style rotor, and it can have two or more blades 121. Other embodiments can include any rotor suitable for converting fluid flow (such as wind or airflow) to rotation for driving a generator. The wind turbine assembly 120 can pivot about the longitudinal axis of the support pole 130 to move with the incoming wind. In operation, the wind turbine assembly 120 can generate between 500 watts and 3 kilowatts of power using a rotor of turbine blades 121 with a diameter (D2 in FIG. 3) ranging between approximately 50 inches and 96 inches (for example, 53 inches).

The solar panels 125 can be attached to or otherwise held up or supported with the support pole 130 by any suitable means. The solar panels 125 convert light to energy according to principles understood by those of ordinary skill in the art. In some embodiments, each solar panel 125 can produce between approximately 50 watts and 200 watts of power.

In some embodiments, the solar panels 125 can be supported by support elements 140, which can resemble the leaves of a plant, such as a tree or flower, for aesthetic purposes. In some embodiments, there can be four support elements 140 and corresponding solar panels 125. In other embodiments, there can be one to eight support elements 140 and corresponding solar panels 125, or another suitable number of support elements and solar panels. Accordingly, the renewable energy structure 100 can resemble a plant, such as a tree or flower, for aesthetic purposes, or in other embodiments, it can have other shapes or resemble other objects.

The aesthetic characteristics of the support elements 140 and other parts of the renewable energy structure 100 can vary based on the locality in which it will be used or installed. For example, in areas where palm trees are located, such as California or Florida, the support elements 140 can be shaped or painted to resemble palm leaves. In areas where maple or oak trees are prevalent, the support elements 140 can be shaped or painted to resemble leafy branches of maple or oak trees. The benches 110 can provide a seating area for users while they use the services provided by the renewable energy structure 100. Accordingly, in some embodiments, renewable energy structures according to the present technology can provide utility while blending in with the local environment.

As described in additional detail below, the electricity provided by the wind turbine assembly 120 or the solar panel structures 125 can be stored in one or more batteries contained in the base 105, within the cover 135, or within or beneath one or more of the benches 110, or in another suitable location. In some embodiments, batteries can be omitted and the electricity can be used immediately to power devices described herein. Although embodiments of the present technology can include both a wind turbine and solar panels, in various embodiments one or both can be omitted. If traditional (on-grid) power is available to the structure, structures according to the present technology can power various devices disclosed herein using the traditional (on-grid) power.

Figure 1A:
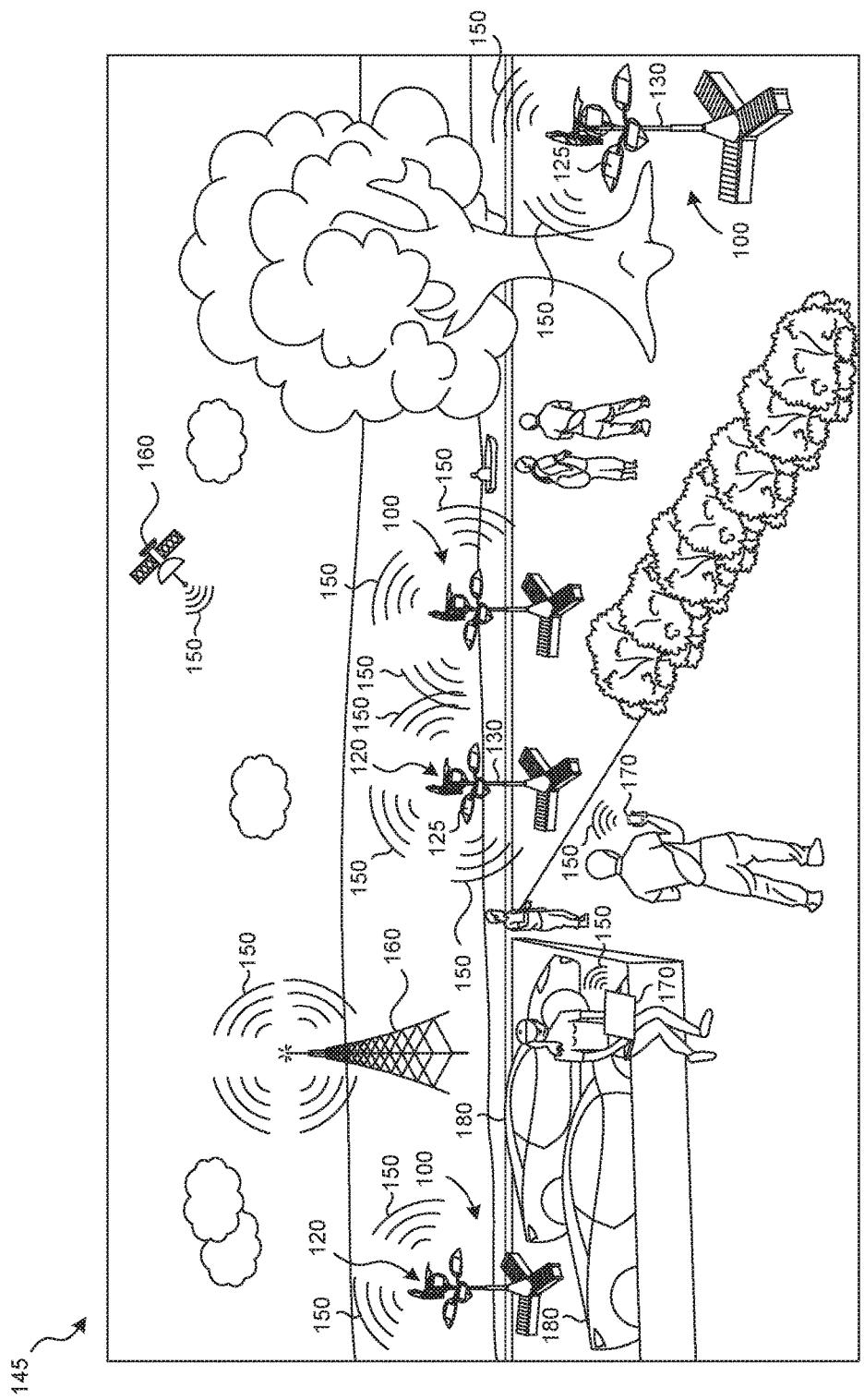
FIG. 1A illustrates a mesh network of a plurality of renewable energy structures according to embodiments of the present technology

FIG. 1A illustrates a mesh network of a plurality of renewable energy structures according to embodiments of the present technology. FIG. 1A shows a location 145, such as a park, parking lot, wilderness, disaster area, rural area, or any other suitable area in which enhanced access to signals or power is desired. One or more renewable energy structures 100 (four are illustrated in FIG. 1A) can be positioned around the location 145. The renewable energy structures 100 can provide access to wireless communication networks or power by relaying wireless communication signals 150 from a host signal source 160, which can be an existing full-size or regional cellular network tower, a satellite, or another existing host signal source 160. In some embodiments, the renewable energy structures 100 can work alone, relaying signals 150 from the host signal source 160 to client devices 170, such as mobile phones or portable computers. In some embodiments, the renewable energy structures 100 can work with each other, relaying signals between each other in a chain configuration. Signal processing techniques for relaying or repeating signals from host signal sources to client devices are known to those of ordinary skill in the art.

One advantage of embodiments of the present technology is that because the structure can include a wind turbine assembly and solar panel structures at an elevated position above ground, the structure can easily accommodate antennas or other signal processing equipment (such as a device 101 in FIG. 1, which can include an antenna) at an elevated position above ground for improved signal transmission or reduced interference from ground objects. Accordingly, the support pole 130 has at least two useful purposes: supporting the energy generation assemblies (such as the wind turbine assembly 120 or the solar panels 125) and elevating signal transmission equipment.

In some embodiments, as described in additional detail below, the renewable energy structures 100 can provide electrical power to charge various devices, such as client devices 170 or electric vehicles 180.

Figure 2:
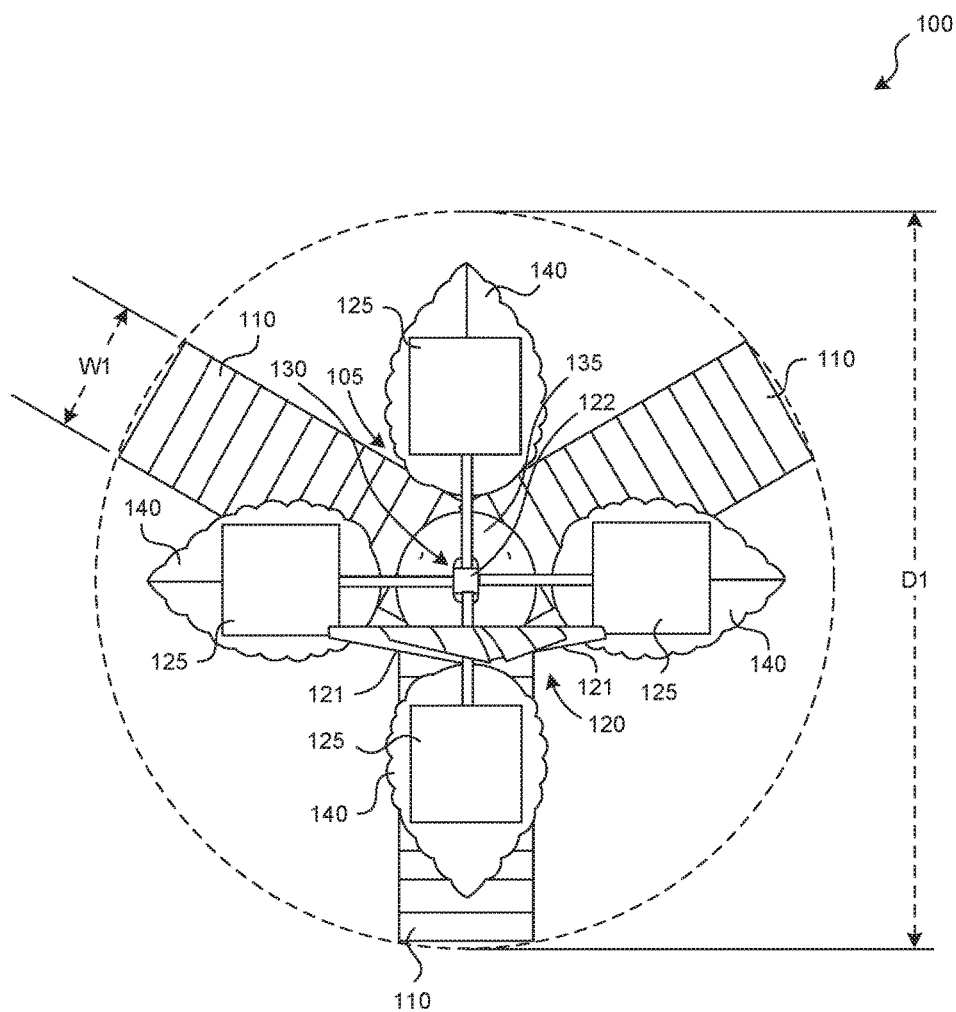
FIG. 2 illustrates a top perspective view of the renewable energy structure shown in FIG. 1.

FIG. 2 illustrates a top perspective view of the renewable energy structure 100 illustrated in FIG. 1. In some embodiments, the base 105 and benches 110 can fit within a circle having diameter D1 of approximately 140 inches, or between 122 inches and 176 inches. In some embodiments, the support elements 140 can fit inside the circle with diameter D1, or in other embodiments, the support elements 140 can extend beyond the circle with diameter D1. Whether the support elements 140 fit within the circle with diameter D1 or extend beyond the circle can affect stability of the structure. In some embodiments in which the structure can be permanently or semi-permanently mounted to the ground, the support elements 140 can extend beyond the circle with diameter D1 to take advantage of the additional stability provided by the permanent mounting to the ground. In other embodiments, in which the structure 100 is merely sitting on the ground or in which it has a lightweight base, the support elements 140 can have a reduced or shortened span to avoid introducing instability such as tipping.

In some embodiments, one or more benches 110 can have a width W1 of approximately 25 inches, or between 20 inches and 36 inches. In other embodiments, the renewable energy structure 100 can have other dimensions suitable for the intended implementation. For example, it can be smaller or larger depending upon the desired power output, the constraints of the location, or the capacity required for seating on the benches 110.

Figure 3:
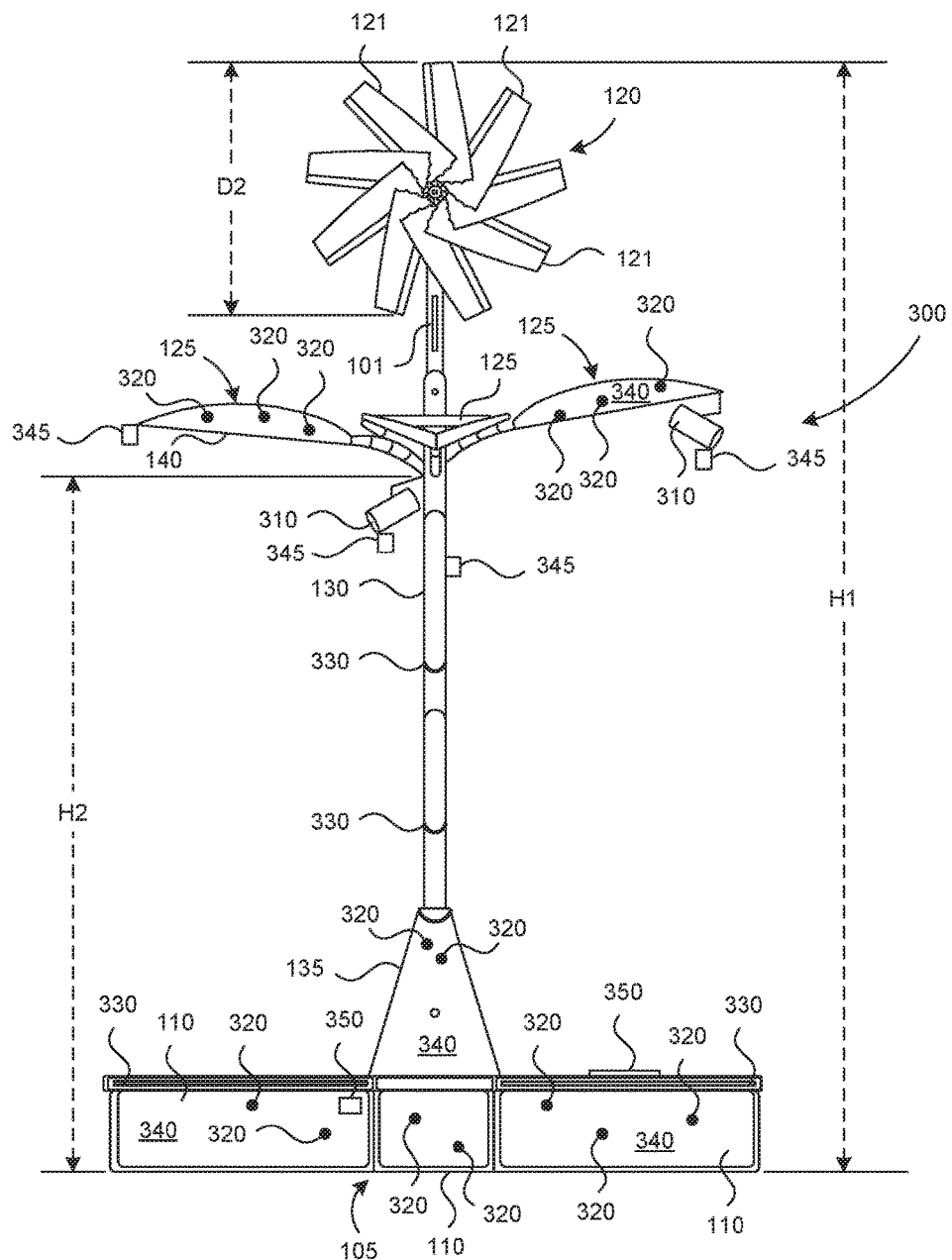
FIG. 3 illustrates a front perspective view of a renewable energy structure according to another embodiment of the present technology.

FIG. 3 illustrates a front perspective view of a renewable energy structure 300 like the renewable energy structure 100 illustrated and described above with regard to FIGS. 1 and 2, with a number of features that can use the power generated by the wind turbine assembly 120 and the solar panel structures 125. For example, renewable energy structures according to embodiments of the present technology can include one or more cameras 310 suitably positioned on the structures. The cameras 310 can include security cameras, webcams, or other kinds of cameras. In some embodiments, a suitable number of cameras can be used to provide a 360° view around the renewable energy structure. For example, a camera 310 can be attached to each support element 140, facing radially outwardly. Cameras 310 can be mounted on the support pole 130 at the base of the support elements 140, or at the tip of the support elements 140, or in any other suitable location. The cameras (which can also be other types of sensors) can provide surveillance for security or safety, or for data collection for use by advertisers, or other functions. For example, the cameras can collect data regarding foot traffic. In some embodiments, one or more of the cameras 310 can store images or video or transmit images or video (in real-time or otherwise) to a security office for analysis by security guards or other officials.

In some embodiments, lights 320 can be positioned in various locations around the base 105, the benches 110, the support elements 140, the cover 135, or other suitable locations to provide ambient, flood, or spot lighting to illuminate the structure 300 as needed for various implementations. For example, lights 320 on the support elements 140 can provide security lighting or street lighting that can optionally be motion-activated using motion sensors 345 or other suitable motion sensing equipment. In some embodiments, the lights 320 can be LED lights, or they can be other types of lights, such as incandescent, fluorescent, neon, or halogen lights, although LED lights typically provide improved efficiency. In some embodiments, lights in the form of LED strips 330 can be used in various locations, such as around the benches 110 or around the support pole 130. The LED light strips 330 can be used to illuminate one or more screens or displays 340 containing advertisements, public service messages, or other indicia, which can be positioned strategically, such as on the benches 110, the cover 135, or under the support elements 140. In some embodiments, advertisements can be positioned on sides of the benches 110 (or other benches), with or without lighting. In some embodiments, advertisements can be positioned on the cover 135, with or without lighting. Although particular kinds of lights are described herein, any lights suitable for illuminating an area or object can be implemented in various embodiments.

In some embodiments, the motion sensors 345 can be included with or connected to any of the electronic devices on or in the structure. For example, the lights, cameras, wireless devices or equipment 101 (such as cellular signal repeaters or Wi-Fi® wireless internet routers), or other electronic devices can rely on motion sensors 345 to activate when people or vehicles pass by. In some embodiments, power can be conserved by only using the devices or equipment when people or vehicles are nearby or when the motion sensors 345 otherwise cause the equipment to activate. An advantage of the present technology is that the structure can create and store power until the power is needed, and the power can be used sparingly. In further embodiments, the lights can be activated as panic lights for emergencies when activated by a user with a switch or button on the renewable energy structure. In some embodiments, motion sensors 345 can be replaced by or augmented with voice-activation equipment. For example, a user can activate a light or phone call (for emergencies or otherwise) at the structure using his or her voice.

In some embodiments, one or more electrical power access points 350, which can include a standard electric plug, a USB® peripheral plug or similar, a wireless electrical power access point (such as an inductive charging point compatible with the Qi TM wireless power technology), or other wired or wireless electrical power access points, can be attached to the renewable energy structures to provide power to various devices such as mobile phones, laptop computers, and electric vehicles. The electrical power access points 350 can be positioned in any suitable location on the structure. For example, the top of a bench 110 can include a wireless charging pad or the side of the bench 110 or base 105 can include a wired power access point (such as a receptacle).

In the embodiment illustrated in FIG. 3, as well as other embodiments of the present technology, an overall height H1 of the renewable energy structure 300 can be approximately 225 inches, or approximately 16 feet to approximately 19 feet. The overall height H1 can include the height H2 of any structure supporting the solar panel structures 125, such as the support elements 140. The height H2 of any structure supporting the solar panel structures 125 or the support elements 140 can be approximately 145 inches or any other height depending on space and use constraints. The benches 110 can be any suitable height to support users. As mentioned above, a turbine diameter D2 can be approximately 53 inches in some embodiments, or other suitable dimensions. In some embodiments, the lowest support element 140 can be approximately (such as at least) 9 feet above the top of a bench in the structure, and one or more of the support elements 140 can be approximately 30 inches below the rotational axis of the wind turbine assembly 120.

Figure 4:
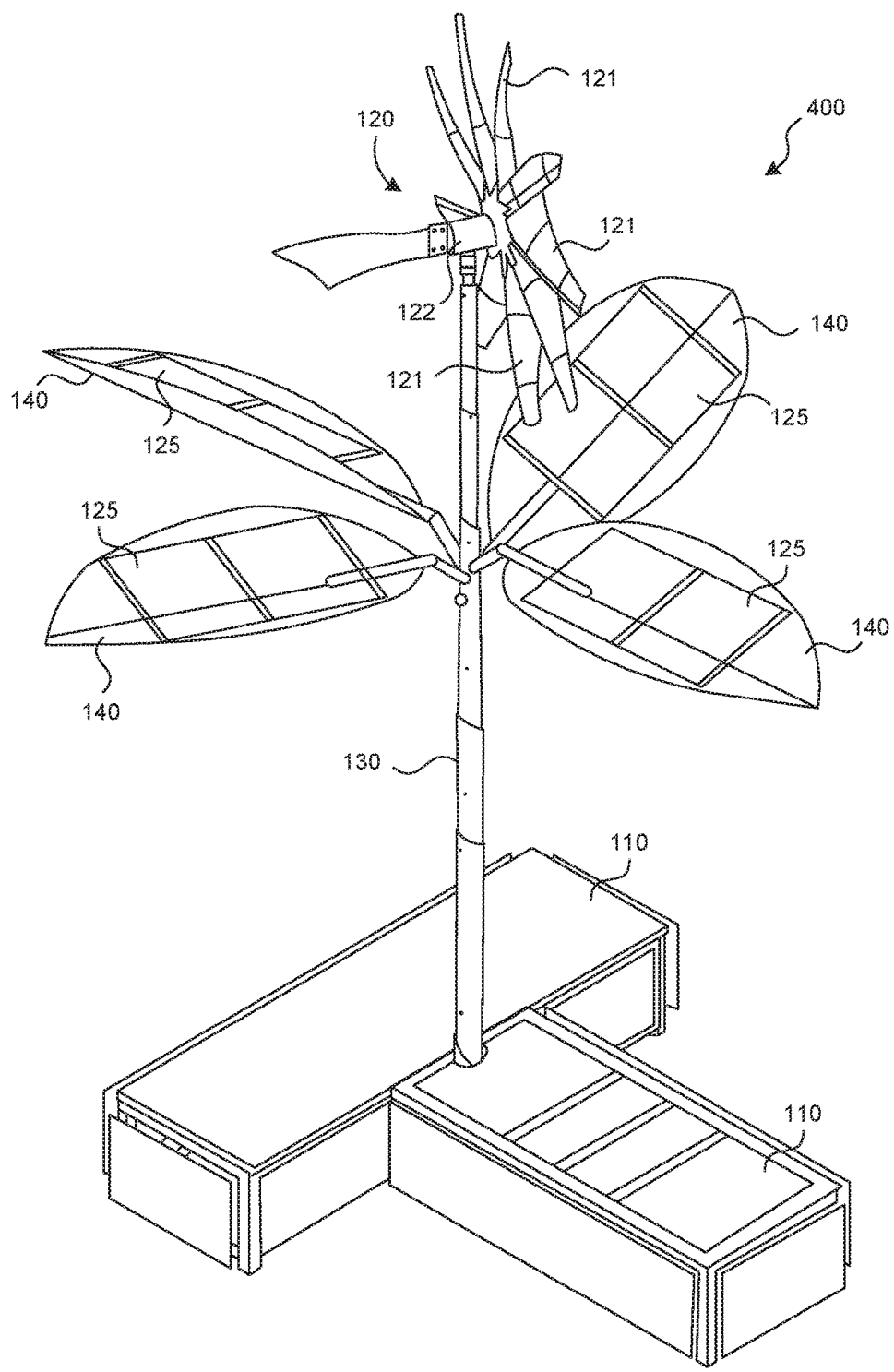
FIG. 4 illustrates a perspective view of a renewable energy structure according to another embodiment of the present technology.

FIG. 4 illustrates a perspective view of a renewable energy structure 400 according to another embodiment of the present technology. The renewable energy structure 400 is generally similar to the structures illustrated and described above with regard to FIGS. 1-3, but it can include two perpendicular benches 410 rather than three benches as in the illustrated embodiments in FIGS. 1-3. The renewable energy structure 400 can include lights, cameras, wireless communication equipment or devices, and advertising as described herein. The support pole 130 can be supported between the benches 110 by the structure of the benches 110 or it can have another suitable supporting structure, which can be covered or surrounded by the benches 110 for aesthetic or other reasons.

According to various embodiments of the present technology, the support pole 130 in the renewable energy structures 100, 300, 400 described herein can be a single piece or formed from multiple pieces, or it can be telescopic or collapsible, as described in further detail below with reference to the telescoping and articulating support pole 500 illustrated in FIGS. 5-9.

FIGS. 5-9 illustrate a telescoping and articulating support pole 500 for a wind turbine assembly 120 having wind turbine blades 121 forming a wind turbine rotor, as well as an associated generator 122 (not visible in FIG. 5, see, e.g., FIG. 4) in accordance with another embodiment of the present technology. Although not illustrated in FIGS. 5-9, solar panel structures, support elements for the solar panel structures, cameras, and lights can be attached to or supported by the support pole as described herein. For example, any suitable manner of attaching the solar panel structures, support elements, cameras, lights, or other equipment can be used. In some embodiments, support elements (140, see FIGS. 1-4) can be welded, fastened, strapped, or otherwise permanently or releasably mounted to the support poles described herein.

Advantages of telescoping and articulating structures according to the present technology include improved portability and easier maintenance relative to existing wind turbine technology. For example, the support pole 500 can be collapsed and the wind turbine assembly 120 or a component thereof removed for easier permanent and temporary moves, such as shipment, relative to existing wind turbine technology. Because the support pole 500 is able to articulate as well as telescope (or in some embodiments, only one or the other), maintenance of the wind turbine assembly 120 is less likely to require tall ladders, scaffolding, climbing equipment, or dangerous maneuvers.

Figure 5:
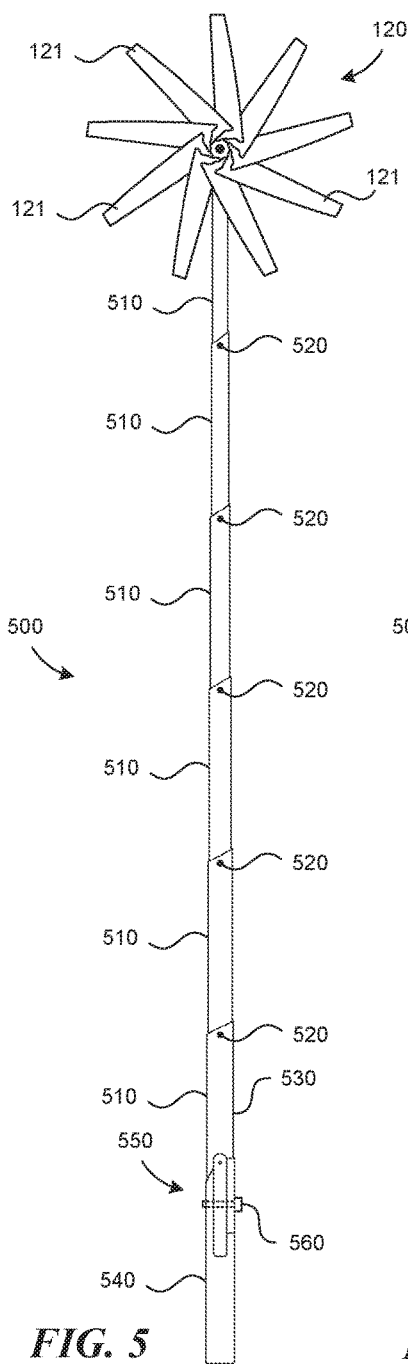

For simplicity in illustration, the wind turbine assembly 120 is illustrated in FIG. 5 but is omitted from FIGS. 6-9. The wind turbine assembly 120 can be attached to the support pole 500 by any suitable means, which can include a rotating structure to maintain alignment with the wind, for example.

FIG. 5 illustrates a side view of the support pole 500 in an extended or raised configuration and in which the wind turbine assembly 120 is illustrated as being attached to a top portion of the support pole 500. The support pole 500 can include a plurality of telescoping pole segments 510, which can be formed from sections of tubing and/or piping that fit inside each other during storage, transportation, and/or other times when the support pole 500 is collapsed from the extended configuration. In the extended configuration (such as in FIG. 5), the support pole 500 forms an extended support pole 130 for use in various embodiments of renewable energy structures. In some embodiments, there can be between two and ten telescoping pole segments 510. In other embodiments, there can be more or fewer or any suitable number of telescoping pole segments 510, depending on desired height, shipping and storage requirements, or other concerns. In the representative embodiment illustrated in FIG. 5, there are six telescoping pole segments 510. In some embodiments, the pole segments 510 can be cylindrical in shape. In other embodiments, the pole segments 510 can have other shapes, including oval, triangle, rectangle, or other suitable rounded or quadrilateral cross-sections.

The telescoping pole segments 510 can be coated with a material to create a tight fit and prevent or reduce vibration, such as a plastic wrap or tape. The telescoping pole segments 510 can be held in extended positions (such as in FIG. 5) by one or more locking elements 520, which can include pins, bolts, shafts, detent mechanisms, or other suitable locking mechanisms or elements. A locking element 520 can pass through one or both sides of each telescoping pole segment 510 to prevent relative movement between the pole segments 510. The lowermost telescoping pole segment 530 of the pole segments 510 is connected to a foundation 540 via an articulating joint 550. The foundation 540 can also be a cylinder (or in other embodiments, it can be other suitable shapes similar to or different from the shape of the pole segments 510) and it can be mounted to the ground by being at least partially buried, cemented, or otherwise attached to the ground or another support surface or supporting structure, such as the base 105 described above with regard to FIGS. 1-4. The articulating joint 550 allows the pole segments 510 to pivot relative to the foundation 540, as described in additional detail below.

Figure 6:
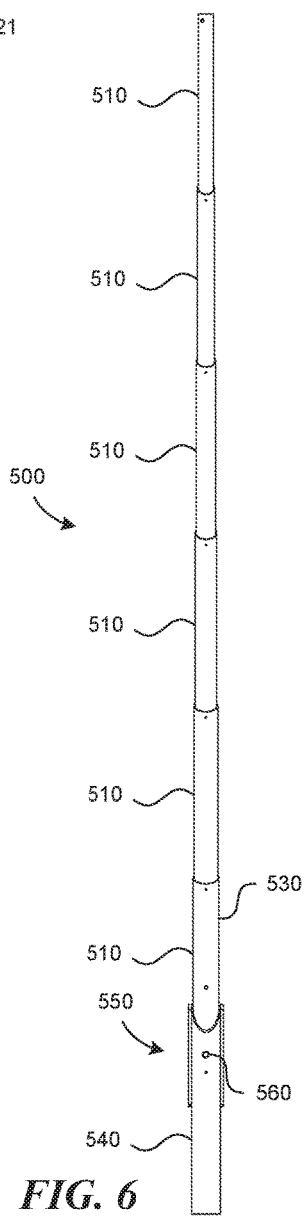

FIG. 6 illustrates a front view of the telescoping and articulating support pole 500 shown in FIG. 5. The wind turbine assembly 120 has been omitted from the illustration for simplicity in illustration. In some embodiments of the present technology, a length of the extended support pole 500 (from the bottom of the foundation 540 to the rotational axis of the wind turbine assembly 120, or to the uppermost end of the wind turbine assembly 120) can be between approximately 6 feet and 30 feet. In other embodiments, the extended support pole 500 can have other overall lengths, depending on power generation needs, transportation capabilities, and characteristics of the installation site.

Figure 7:
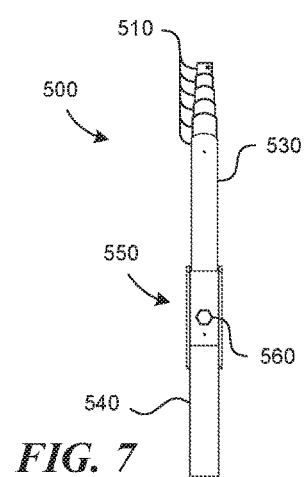

FIG. 7 illustrates a rear view of the support pole 500 in a collapsed configuration, in which the telescoping pole segments 510 have been collapsed into the lowermost telescoping pole segment 530. The wind turbine assembly 120 has been omitted from the illustration for simplicity. In a collapsed configuration, the support pole 500 can be stored, transported, and/or serviced, for example.

FIGS. 8 and 9 illustrate perspective and side views, respectively, of the support pole 500 shown in FIGS. 5-7, in which the telescoping pole segments 510 are extended and pivoted relative to the foundation 540 via the articulating joint 550. The wind turbine assembly 120 is omitted from the illustrations in FIGS. 8 and 9 for simplicity. In the extended and pivoted configuration, the support pole 500 can generally be aligned with the ground or at least lowered toward the ground to allow a user to service the support pole 500 and/or the wind turbine assembly 120.

The joint 550 includes a pivot joint 800, which can be formed by passing a bolt or other rod 810 through an intermediate portion of the lowermost telescoping pole segment 530 (away from a terminal end of the lowermost pole segment 530) and through the foundation 540. The telescoping pole segments 510 can pivot relative to the foundation 540 about the rod 810. In some embodiments, other suitable mechanisms for forming the pivot joint 800 can be used. A side portion 820 of the foundation 540 can be shaped to prevent the lowermost pole segment 530 from over-rotating, while an open region 830 opposite the side portion 620 allows the lowermost pole segment 530 to pivot between positions parallel to the foundation 540 (seen in FIGS. 5-7) and positions angled relative to the foundation 540 (seen in FIGS. 8-9). The side portion 820 can have an upper edge 840 that is higher than a lower edge 850 of the open region 830.

With reference again to FIGS. 5-7, when an operator wishes to lock the support pole 500 in a vertical position, as illustrated in FIGS. 5-7, the operator can insert a fastener 560, such as a bolt, pin, rod, or other suitable fastener or fastening mechanism through the lowermost pole segment 530 and the foundation 540. Such a fastener 560 prevents the lowermost pole segment 530 and the foundation 540 from rotating relative to each other, keeping the support pole 500 in the upright or vertical configuration. In other embodiments, other suitable elements for maintaining the support pole 500 in a vertical configuration can be used.

Figure 10:
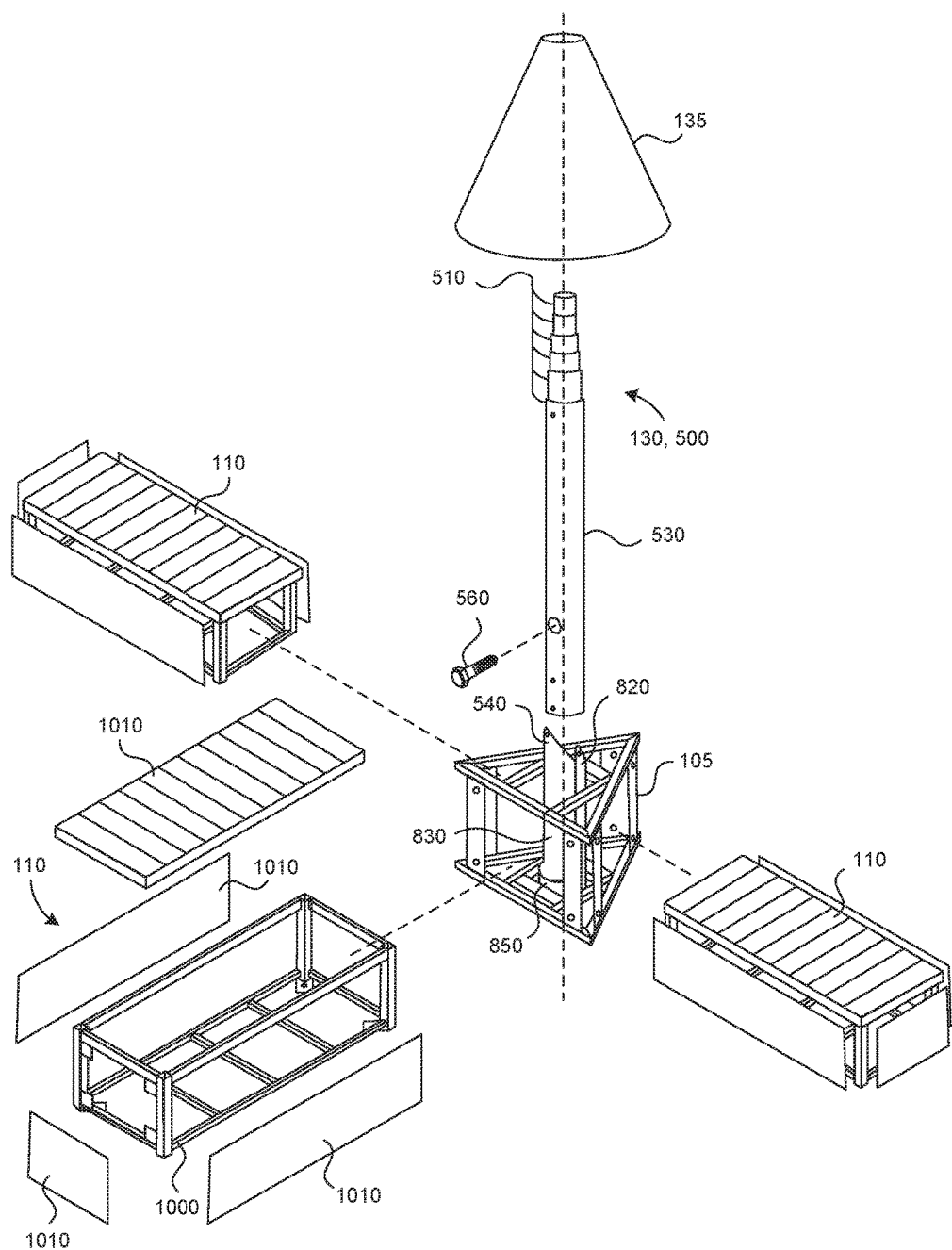
FIG. 10 illustrates a partially exploded, perspective view of a lower portion of a renewable energy structure (such as the structures illustrated in FIGS. 1-3) using a telescoping and articulating support pole to support a wind turbine assembly or solar panel structures, according to an embodiment of the present technology

FIG. 10 illustrates a partially exploded, perspective view of a lower portion of a renewable energy structure (such as the structures 100, 300 described above with regard to FIGS. 1-3) using a telescoping and articulating support pole 500 to support a wind turbine assembly 120 (not shown, for ease of illustration) or solar panel structures 125 (not shown, for ease of illustration) in a similar manner as the support pole 130 described above, according to an embodiment of the present technology. A portion of the foundation 540 can be buried in the ground or otherwise supported (the portion beneath the lower edge 850 of the open region 830). The base 105 can be positioned around the foundation 540. The base 105 can be in the form of a frame or other structure suitable for providing support to connected elements. The base 105 can be triangular if there are three benches 110 to be attached, or it can be other shapes or configurations if more or fewer benches 110 are included. Each bench 110 can be formed in any suitable manner, for example, as a frame 1000 with sheets or panels 1010 mounted thereon. The panels 1010 can carry displays 340, screens, seating surfaces, or other suitable elements. The frames 1000 can be attached to the base 105. The support or pole 130, 500 can be pivotably attached to the foundation 540 as described above. The cover 135 can cover any openings in the base 105 that are not otherwise covered by other structure.

Figure 11:
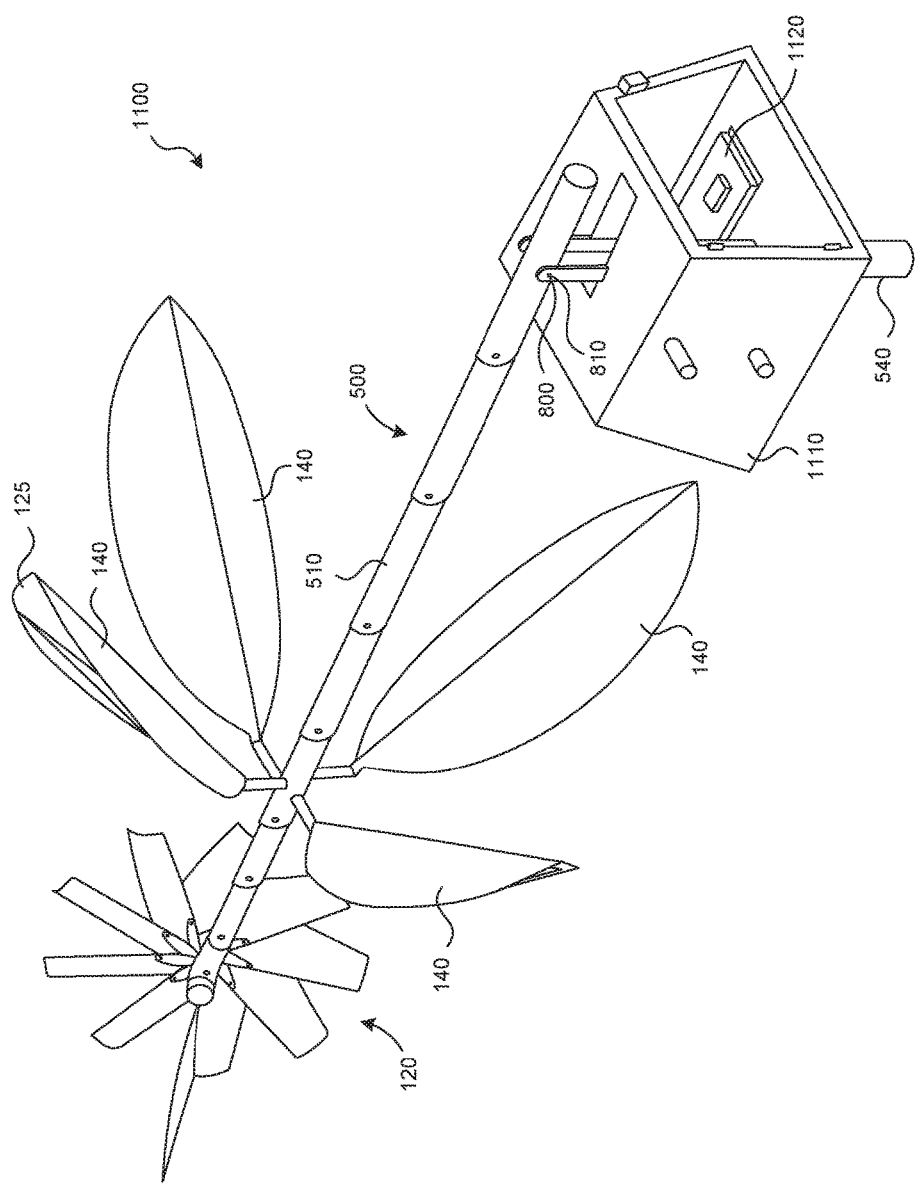
FIG. 11 illustrates a perspective view of a renewable energy structure according to another embodiment of the present technology, in a lowered position for installation or maintenance, for example.

FIG. 11 illustrates a perspective view of a renewable energy structure 1100 according to another embodiment of the present technology. The structure 1100 can be generally similar to other structures disclosed herein, with a wind turbine assembly 120, solar panel structures 125, and support elements 140 supported by a telescoping and articulating support pole 500, which is illustrated in a lowered position similar to the position illustrated and described above with regard to FIGS. 8 and 9. In some embodiments, a box or container 1110 can be placed around the foundation 540 to contain components 1120 associated with the renewable energy structure 1100, such as electronics or other devices associated with wireless networking equipment, cameras, lights, batteries, or other devices. The container 1110 can protect the components 1120 from tampering or weather.

Figure 12:
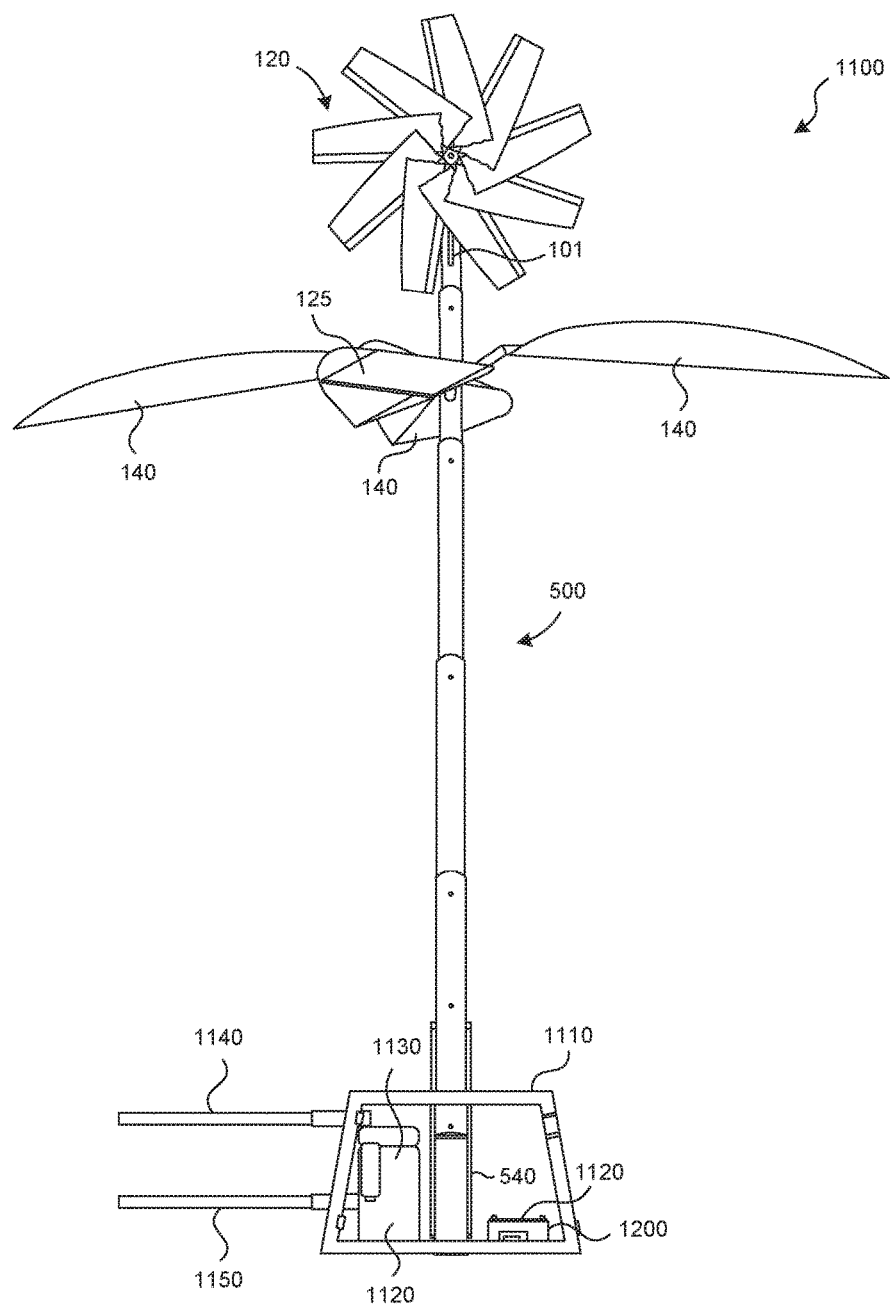
FIG. 12 illustrates a front view of the renewable energy structure illustrated in FIG. 11, in an upright position.

FIG. 12 illustrates a front view of the renewable energy structure 1100 illustrated in FIG. 11, in an upright position. One or more components 1120 can be positioned in the container 1110 around the foundation 540. In some embodiments, the components 1120 can include a battery 1200 to power external devices plugged into or otherwise connected to electrical power access points on the structure 1100 (in the manner explained for previous figures or in other suitable manners) or to power other components 1120. The battery can be charged by the solar panel structures 125 or the wind turbine assembly 120. Other components 1120 can include wireless communications equipment or devices 101, such as wireless internet routers, cellular repeaters, or electronics associated with other functions. In some embodiments, a component 1120 can include a water filtration or purification system 1130 which can provide clean water in remote areas using power from the sun or wind. An input line 1140 can bring source water into the purification system 1130 and an output line 1150 can carry the clean water out, via a faucet, fountain, or into storage. An advantage of embodiments of the present technology is that remote or third-world areas can have clean water or access to wireless communications signals (such as wireless internet or cellular telephone, or other wireless communications signals) even in the absence of electrical infrastructure, or cities can provide nearly self-sustaining water fountains in parks or other locations. In some embodiments, the container 1110 can be locked or otherwise secured to prevent tampering or theft.

In some embodiments, the renewable energy structure 1100 can be between 18 and 25 feet tall (for example, 19.2 feet tall) and approximately 12 to 14 feet wide (for example, 13.5 feet wide, from the tip of one support element 140 to an opposing support element 140). The wind turbine assembly 120 can have a rotor diameter between 3 and 5 feet (for example, 4.4 feet). The support elements 140 (holding the solar panel structures 125) can be elevated between 11 and 14 feet above the ground (for example, 12.8 feet). Dimensions provided herein are representative only and the structure 1100 can have other suitable dimensions.

Figure 13:
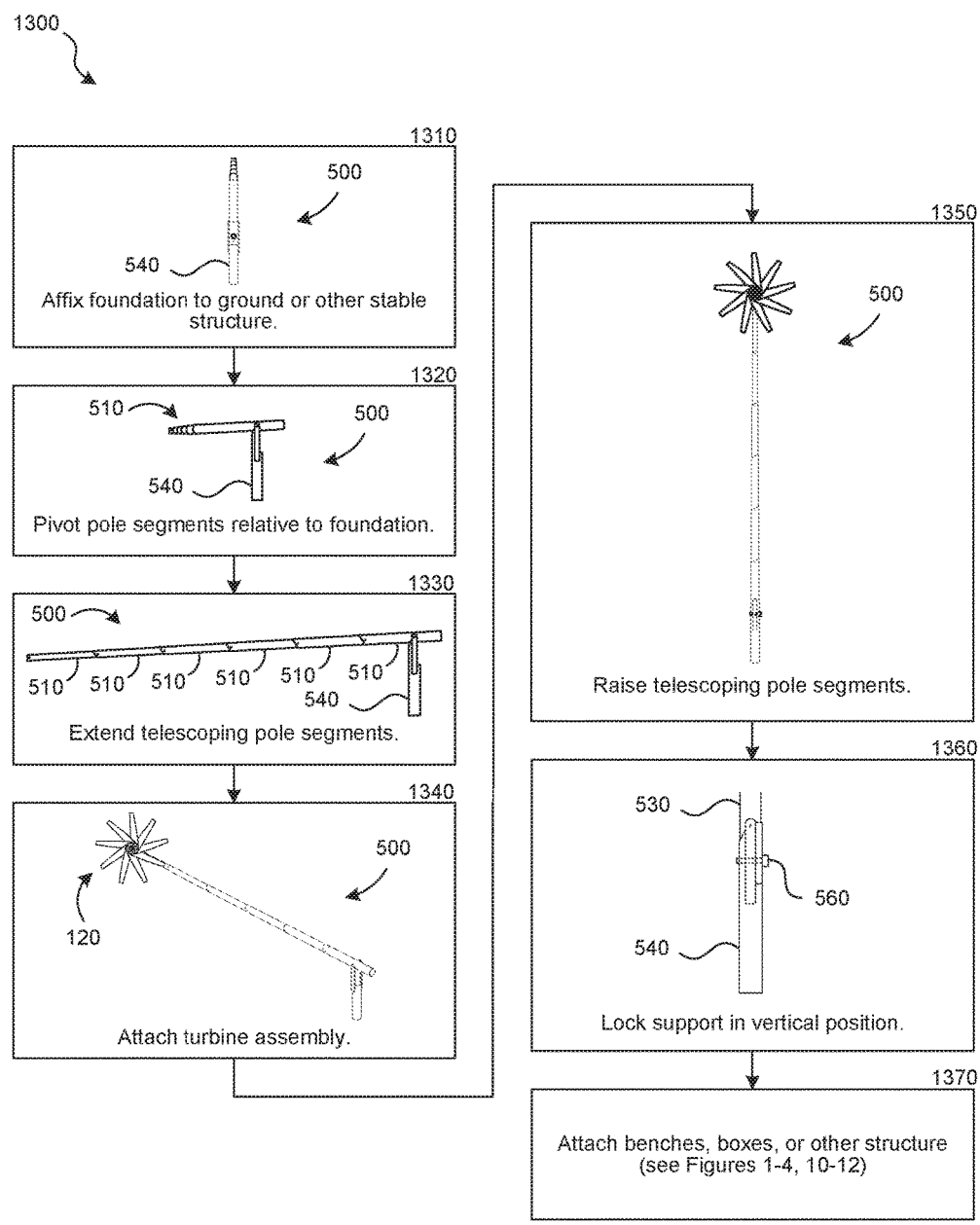
FIG. 13 illustrates a flowchart of general steps for installing or raising a telescoping and articulating support pole in accordance with an embodiment of the present technology

FIG. 13 illustrates a flowchart 1300 of general steps for installing or raising a telescoping and articulating support (such as the support pole 500) in accordance with an embodiment of the present technology. In block 1310, the foundation 540 can be affixed to the ground or another stable structure, either permanently or removably. In block 1320, the pole segments 510 can be pivoted relative to the foundation 540 so that they are lowered or parallel to the ground to be convenient for a user to access. In block 1330, the telescoping pole segments 510 can be extended to their full length. Extending the telescoping pole segments 510 to their full length can include pulling or otherwise moving the telescoping pole segments 510 relative to each other to form the elongated pole structure, and then pinning or bolting the pole segments 510 relative to each other to prevent relative movement, for example, using the locking elements 520 described above with regard to FIG. 5. In block 1340, the wind turbine assembly 120 can be attached to the top pole segment of the pole segments 510. In block 1350, the pole segments 510 can be pushed, pulled, or otherwise pivoted to be raised to a vertical position (for example, by hand, by a guy wire, or by another suitable mechanism for pivoting the support pole 500). In block 1360, the joint 550 can be locked such that the support is in a vertical position, using the fastener 560 (other suitable locking mechanism). In some embodiments, the support pole 500 can be stowed or disassembled by following the steps in the flowchart 1300 in reverse. In some embodiments, steps can be performed in other sequences. For example, the wind turbine assembly 120 can be attached before or after extending the pole segments in block 1330.

In some embodiments, as shown in block 1370, the method for assembling a renewable energy structure can include attaching boxes or containers, benches, wireless communications components, cameras, lights, or other structures, as described above with regard to FIGS. 1-4 and 10-12. The attaching step in block 1370 can be performed at any suitable time during the installation process. For example, a base 105 can be positioned around the foundation 540 before or after the support pole 500 is raised to a vertical orientation (block 1350). The cover 135 can be positioned on the base 105 around the pole 500 after the support pole 500 is raised to the vertical orientation. In some embodiments, a box or container 1110 can be positioned around the foundation 540. In some embodiments, support elements 140 (see FIGS. 1-4 and 10-12) can be installed, mounted, or otherwise attached to the support pole 500 at any suitable point in the installation process. In a representative embodiment, the support elements 140 can be attached to the support pole 500 in block 1340 when the turbine assembly 120 is attached.

Figure 14:
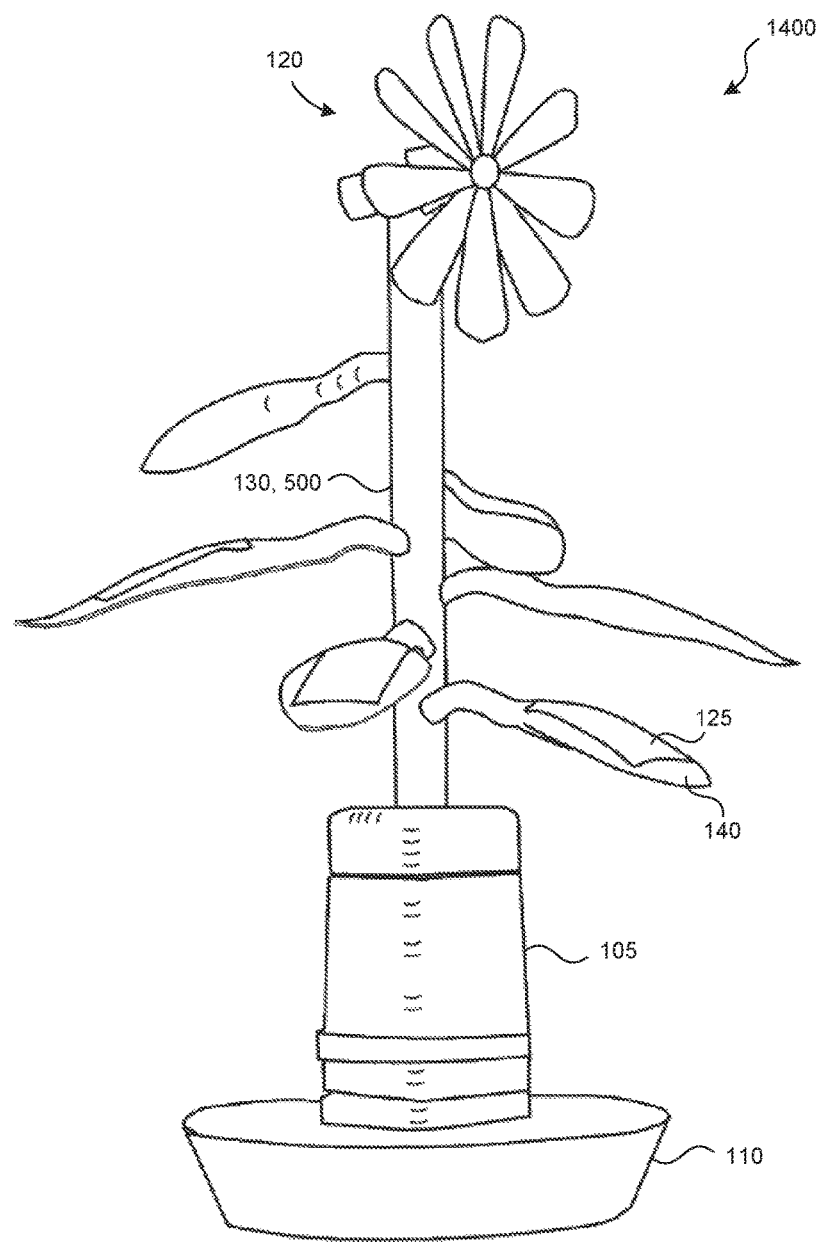
FIG. 14 illustrates a perspective view of a renewable energy structure according to another embodiment of the present technology.

FIG. 14 illustrates a perspective view of a renewable energy structure 1400 according to another embodiment of the present technology. The structure 1400 can be generally similar to the other renewable energy structures disclosed herein, including a wind turbine assembly 120 or solar panel structures 125 with optional support elements 140, all supported by a support pole 130 or a telescoping and articulating support pole 500. It can include a rounded base 105 and a rounded bench 110. Electronics and components can be housed within the rounded base 105 or bench 110.

Figure 15:
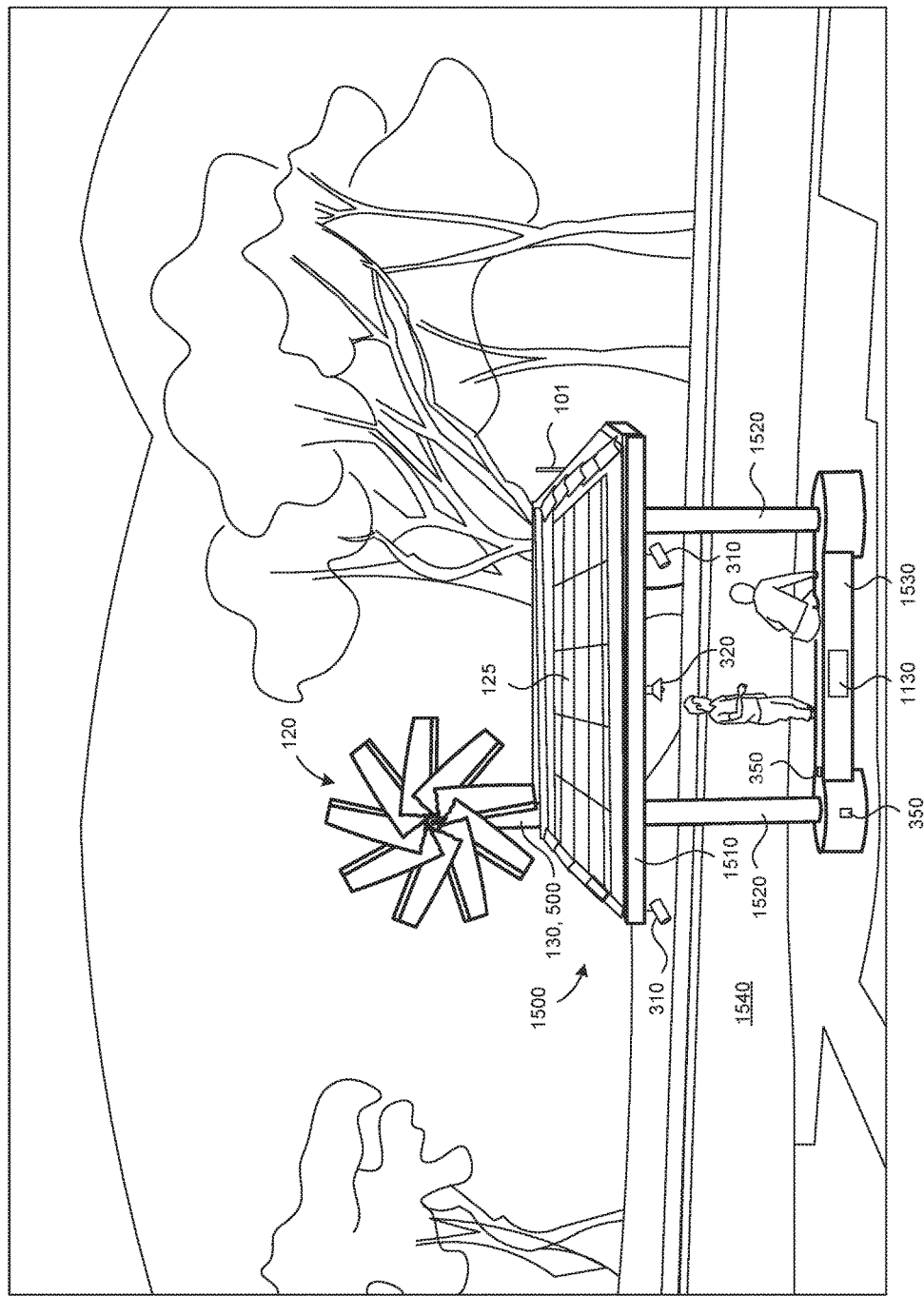
FIGS. 15 and 16 illustrate bus stops with wind turbine assemblies and solar panel structures, according to embodiments of the present technology.
Figure 16:
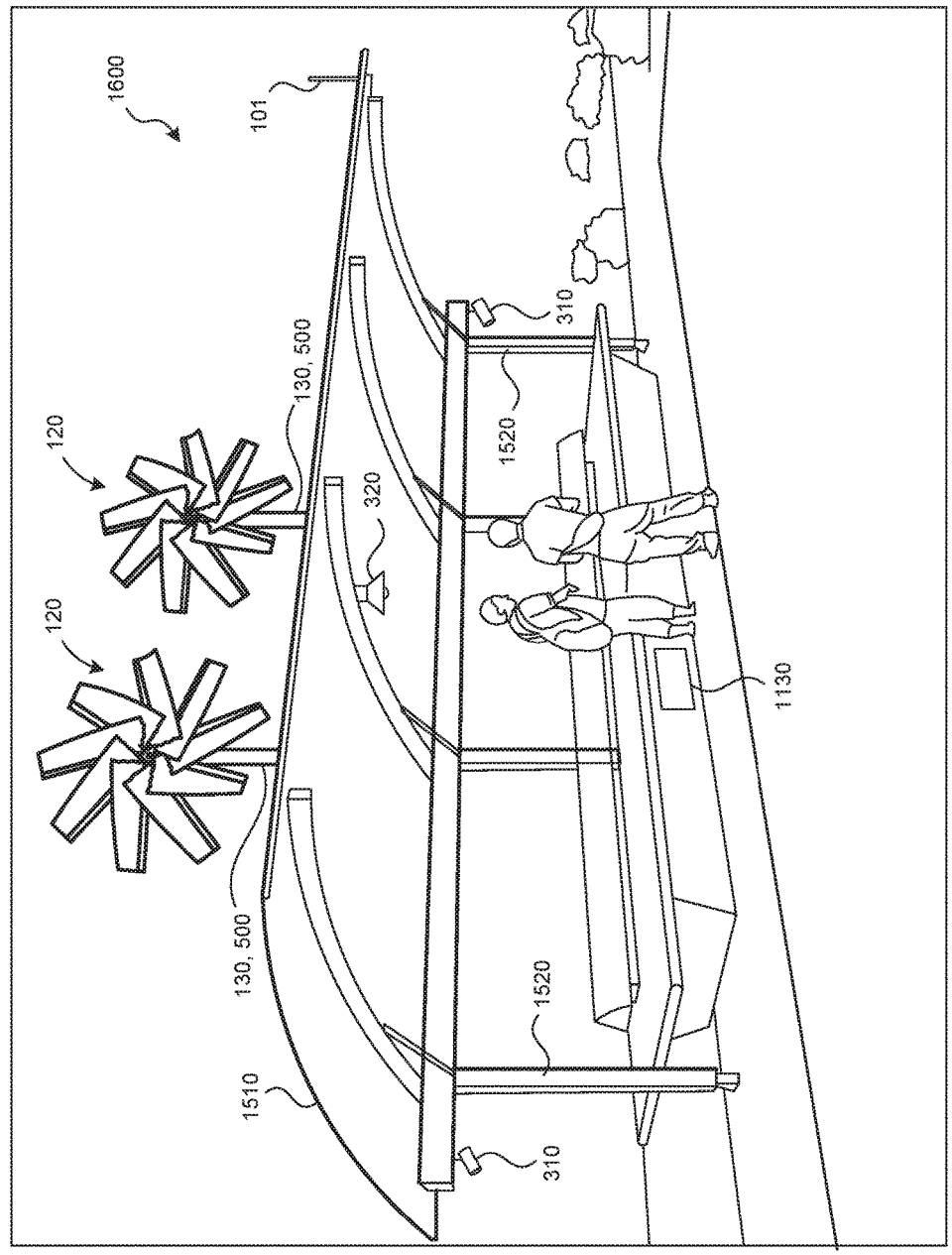

Embodiments of the present technology can also be adapted to existing benches and structures, such as in a new or retrofit application. For example, as illustrated in FIGS. 15 and 16, embodiments of the present technology can include bus stops with wind turbine assemblies and solar panels. With regard to FIG. 15, a bus stop 1500 can include a roof 1510 with one or more solar panel structures 125. The roof 1510 can be supported by one or more support poles 1520. A bench 1530 can be positioned beneath the roof 1510. In some embodiments, the bench 1530 can extend to or be positioned outside of the area beneath the roof 1510. The bus stop 1500 can be positioned near a road 1540. A wind turbine assembly 120 can be attached to or supported near the bus stop 1500. For example, the wind turbine assembly can be supported by a support pole 130 or telescoping and articulating support pole 500 attached to the bus stop 1500, with the bus stop 1500 used as a base for the support pole 1500 or an attachment point for a foundation of the support pole 1500. The wind turbine assembly 120 and the solar panel structure(s) 125 generate electricity to provide power for the bus stop 1500 to power components like cameras 310, lighting 320, wireless communications devices and equipment 101 (such as Wi-Fi® wireless internet equipment or cellular equipment such as antennas or routers), electrical power access points 350, water purification systems 1130 (to provide drinking water, for example), or other suitable devices, such as those described herein. In some embodiments, more than one wind turbine assembly 120 can be attached to a bus stop, such as the bus stop 1600 illustrated in FIG. 16, which can include some or all of the other features illustrated and described with regard to FIG. 15.

Although bus stops are described, the structures described herein can be used as other facilities, such as rest stations, picnic areas (with one or more tables beneath the roof), or pavilions.

Figure 17:
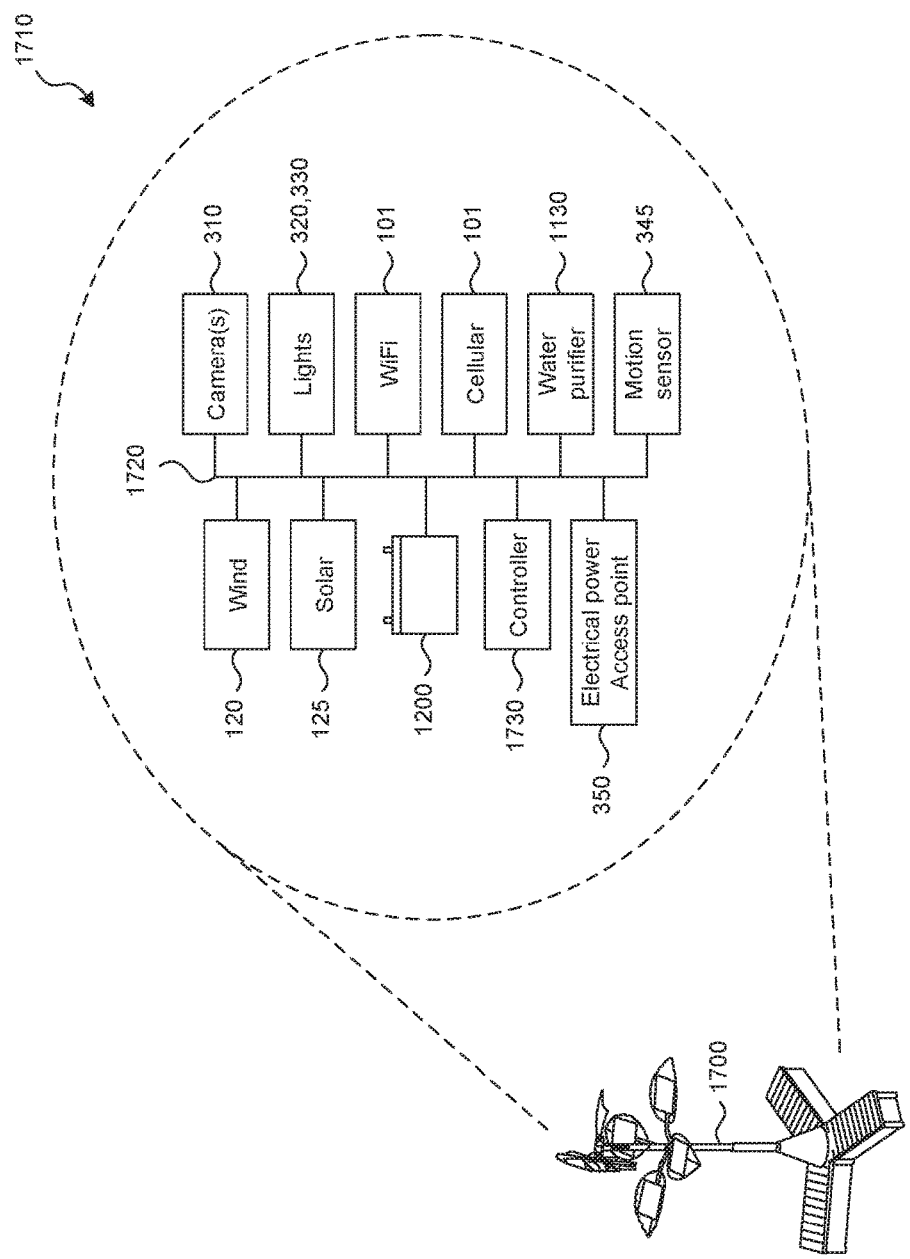
FIG. 17 illustrates a block diagram of an electronics system in a renewable energy structure in accordance with an embodiment of the present technology.

FIG. 17 illustrates a block diagram of components associated with a renewable energy structure 1700 in accordance with an embodiment of the present technology. FIG. 17 presents an electronics system 1710 that can be implemented in the renewable energy structures described herein. The electronics system 1710 can include one or more of the various electricity generation assemblies described herein (such as wind turbine assembly 120 or one or more solar panel structures 125) and one or more of the various components described herein for storing, using, or distributing electricity from the electricity generation assemblies. The electronics system 1710, which can be in, on, connected to, or otherwise associated with the renewable energy structure 1700 can include a bus 1720 that connects the various components. The bus 1720 can include multiple channels or wires, and it can include one or more physical connections to permit unidirectional or omnidirectional communication, and/or the transmission of power between two or more of the components in the electronics system 1710. In some embodiments, components connected to the bus 1720 can be connected to each other or external connections through wireless technologies. Although a bus 1720 is illustrated, other suitable connections between components can be used. For example, the bus 1720 can include or be connected to one or more controllers 1730, such as one or more power controllers, to manage power input and use between components in the electronics system 1710. In some embodiments, the various devices and components can include their own individual controllers to manage power input and use.

In some embodiments, the wind turbine assembly 120 or the solar panel structures 125 can be connected to other various components directly or indirectly via the bus 1720. For example, the wind turbine assembly 120 or the solar panel structures 125 can be connected to a battery 1200 for storing electricity generated by the wind turbine assembly 120 and/or the solar panel structures 125. The battery 1200 can be any suitable type of battery, such as a lithium polymer, lithium ion, lead acid, nickel-metal hydride (NiMH), nickel cadmium (NiCd), or other type of battery suitable for providing power and being recharged.

Other components that can be part of the electronics system 1710 include: cameras 310, lights 320 or LED strips 330, wireless communication devices or equipment 101 such as wireless internet or cellular communications equipment, water purification systems 1130, motion sensors 345, electrical power access points 350, or other devices that use or generate electricity or communications. The components in the electronics system 1710 can be connected to the battery 1200 or controller 1730 (via the bus 1720 or otherwise) for using electricity from the wind turbine assembly 120 or the solar power structure 125. In some embodiments, the components can use battery power or they can optionally use power directly provided by wind and solar power. In some embodiments, the components can operate as described with regard to the previous figures.

The components can be connected to each other for communication with each other. For example, in some embodiments, the controller(s) 1730 can manage energy distribution and use by receiving input from the motion sensors 345 or the communications equipment 101 to activate or deactivate other components of the electronics system 1710 and the renewable energy structure 1700. Accordingly, in some embodiments, renewable energy structures 1700 can be autonomous or remotely controlled.

Embodiments of the present technology can be self-sustaining and can require no hard connection to a power or communications grid, although such connections can be optional in some embodiments. Embodiments of the present technology can include wireless communications devices or equipment such as cellular or wireless telephone components to provide improved cellular or wireless communication by functioning as a local or portable signal repeater or hub. Likewise, embodiments of the present technology can be used to position wireless internet routers around various locations, such as within cities or in rural off-grid locations, without requiring access to a larger power grid. Accordingly, embodiments of the present technology can be placed—permanently or temporarily—in areas where wireless signals are otherwise low or bandwidth is in high demand, such as sporting events, concerts, or remote areas. Providers of the communications channels provided by embodiments of the present technology can monitor traffic for data collection to target advertisements or otherwise gather statistics.

Embodiments of the present technology can also provide charging stations for users of portable devices who are not otherwise near a source of power. For example, visitors to the renewable energy structures or bus stops disclosed herein can plug into power access points, such as electrical power access points or USB® peripheral connection ports, to charge mobile devices.

Because embodiments of the present technology include collapsible or telescoping supports (such as the support pole 500), the technology can be transported, stored, or maintained with relative ease compared to full size wind turbine, solar panel, or wireless signal repeater structures.

The power generated by the wind turbine assemblies and/or solar panels can be used in any suitable manner, especially where such power is needed in remote or off-grid locations, or to supplement on-grid locations. Advertisements positioned on embodiments of the present technology can provide a source of revenue for profit or to pay for the construction and maintenance of embodiments of the technology, or such advertisements can be used to convey public service announcements, news, or other information. In some embodiments, electrical power access points can be used to charge electric vehicles.

Components of the present technology can be made with various materials or combinations of materials, including metal, plastic, composites, or organic materials such as wood. One of ordinary skill in the art will know what materials can be appropriate to provide structural soundness to the present technology. However, for ease of transporting the present technology, lightweight materials are desirable in some embodiments.

From the foregoing, it will be appreciated that specific embodiments of the disclosed technology have been described for purposes of illustration, but that various modifications can be made without deviating from the technology, and elements of certain embodiments can be interchanged with those of other embodiments. For example, although support poles are described, other supporting structures may be used to hold up or support energy generation assemblies (such as a wind turbine assembly and/or solar panels), signal transmission equipment, cameras, lights, and/or other aspects of the present technology.

Further, while advantages associated with certain embodiments of the disclosed technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein, and the invention is not limited except as by the appended claims.

What is claimed is:

1. A structure for providing wireless communication coverage and off-grid electrical power, comprising:
   a telescoping support pole pivotably attached to a cylindrical foundation, wherein the support pole comprises a plurality of pole segments and at least one locking element, the locking element carried by at least one of the pole segments and positioned to limit relative movement between two of the pole segments;
   a base positioned around the foundation, the base comprising a first frame;
   a wind turbine assembly for converting wind to electrical power, the wind turbine assembly supported by the support pole;
   a first support element carried by the support pole and extending generally radially outwardly from the support pole, the first support element being positioned beneath the wind turbine assembly;
   a second support element carried by the support pole and extending generally radially outwardly from the support pole, the second support element being positioned beneath the wind turbine assembly;
   a first solar panel structure for converting light to electrical power, the first solar panel structure being supported by the first support element;
   a second solar panel structure for converting light to electrical power, the second solar panel structure being supported by the second support element;
   a battery connected to the wind turbine assembly and the first solar panel structure;
   a wireless communication device;
   one or more benches configured to provide seating, wherein at least one of the benches comprises a second frame attached to the first frame, the at least one of the benches comprises panels mounted to the second frame, and at least one of the panels carries a display; and
   a wireless electrical power access point connected to the battery and positioned on a top of one of the one or more benches.

2. The structure of claim 1, further comprising one or more cameras supported by the support pole, the structure further comprising one or more lights.

3. A structure for providing wireless communication coverage, comprising:
   a foundation;
   a base positioned around the foundation, wherein the base comprises a frame, and wherein the foundation extends below the base;
   a support pole pivotably connected to the foundation, the support pole comprising a plurality of telescoping pole segments and one or more locking elements passing through at least a portion of one of the telescoping pole segments and positioned to limit relative movement between two of the telescoping pole segments;
   a wind turbine assembly for converting wind to electrical power, the wind turbine assembly supported by the support pole;

a plurality of support elements carried by the support pole and positioned beneath the wind turbine assembly, each support element of the plurality of support elements extending radially outwardly from the support pole;

a plurality of solar panel structures for converting light to electrical power, each solar panel structure of the plurality of solar panel structures being supported by a corresponding support element of the plurality of support elements; and one or more components supported by the structure, wherein the one or more components comprise a cellular telephone signal repeater or a wireless internet router.

4. The structure of claim 3 wherein the frame is triangular.

5. The structure of claim 3, wherein the frame is a first frame, the structure further comprising one or more benches attached to the first frame, wherein at least one of the benches comprises a second frame and panels mounted to the second frame, and wherein at least one of the panels comprises a display.

6. The structure of claim 3, further comprising a camera supported by the support pole.

7. The structure of claim 5, further comprising an electrical power access point on at least one of the one or more benches.

8. A system for providing access to a wireless communication network, the system comprising a plurality of renewable energy structures, each renewable energy structure comprising:

wind turbine assembly;

a foundation;

a telescoping support pole pivotably attached to the foundation and positioned to support the wind turbine assembly above the foundation;

a plurality of solar panel structures positioned beneath the wind turbine assembly, each solar panel structure of the plurality of solar panel structures being supported by a corresponding support element extending generally outwardly from the telescoping support pole; and a wireless communication device configured to relay wireless communication signals between a host signal source and a client device;

wherein the renewable energy structures are configured to relay signals between each other to form a mesh network; and wherein at least one renewable energy structure of the plurality of renewable energy structures further comprises one or more benches and one or more displays positioned on at least one of the benches.

9. The system of claim 8, wherein the wireless communication device comprises a cellular telephone signal repeater.

10. The system of claim 8, wherein at least one renewable energy structure of the plurality of renewable energy structures further comprises a container positioned around the foundation.

11. The system of claim 10 wherein the container contains a water purification system.

12. The system of claim 8, wherein at least one renewable energy structure of the plurality of renewable energy structures further comprises a camera or a light supported by the support pole.

13. The structure of claim 1, further comprising one or more motion sensors and a controller, the controller configured to activate or deactivate the wireless communication device based on input from the one or more motion sensors.

14. The structure of claim 1, further comprising a wired electrical power access point positioned on a side of one of the one or more benches.

15. The structure of claim 3, wherein at least one of the support elements is shaped as a tree leaf.

* * * * *